(12) United States Patent
Von Malm et al.

(10) Patent No.: US 10,074,766 B2
(45) Date of Patent: Sep. 11, 2018

(54) METHOD FOR PRODUCING SEMICONDUCTOR COMPONENTS AND SEMICONDUCTOR COMPONENT

(71) Applicant: OSRAM Opto Semiconductors GmbH, Regensburg (DE)

(72) Inventors: Norwin Von Malm, Nittendorf (DE); Alexander F. Pfeuffer, Regensburg (DE); Tansen Varghese, Regensburg (DE); Philipp Kreuter, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/119,376

(22) PCT Filed: Feb. 17, 2015

(86) PCT No.: PCT/EP2015/053278
§ 371 (c)(1),
(2) Date: Aug. 16, 2016

(87) PCT Pub. No.: WO2015/124551
PCT Pub. Date: Aug. 27, 2015

(65) Prior Publication Data
US 2017/0062351 A1    Mar. 2, 2017

(30) Foreign Application Priority Data
Feb. 18, 2014 (DE) .................. 10 2014 102 029

(51) Int. Cl.
*H01L 31/18* (2006.01)
*H01L 31/0224* (2006.01)
(Continued)

(52) U.S. Cl.
CPC ........ *H01L 31/1892* (2013.01); *H01L 23/544* (2013.01); *H01L 31/02245* (2013.01);
(Continued)

(58) Field of Classification Search
CPC ........... H01L 2223/5446; H01L 23/544; H01L 2933/0016; H01L 31/02245;
(Continued)

(56) References Cited

U.S. PATENT DOCUMENTS 4,295,002 A * 10/1981 Chappell ......... H01L 31/035281
136/244
5,406,515 A * 4/1995 Rajeevakumar ............................
H01L 27/10829
257/309
(Continued)

FOREIGN PATENT DOCUMENTS

| CN | 102177595 A | 9/2011 |
| CN | 102931309 A | 2/2013 |

(Continued)

*Primary Examiner* — Sophia Nguyen
(74) *Attorney, Agent, or Firm* — McDermott Will & Emery LLP

(57) ABSTRACT

A method for producing a plurality of semiconductor components (1) is provided, comprising the following steps: a) providing a semiconductor layer sequence (2) having a first semiconductor layer (21), a second semiconductor layer (22) and an active region (25), said active region being arranged between the first semiconductor layer and the second semiconductor layer for generating and/or receiving radiation; b) forming a first connection layer (31) on the side of the second connection layer facing away from the first semiconductor layer; c) forming a plurality of cut-outs (29) through the semiconductor layer sequence; d) forming a conducting layer (4) in the cut-outs for establishing an electrically conductive connection between the first semiconductor layer and the first connection layer; and e) sepa-
(Continued)

Figure 3:
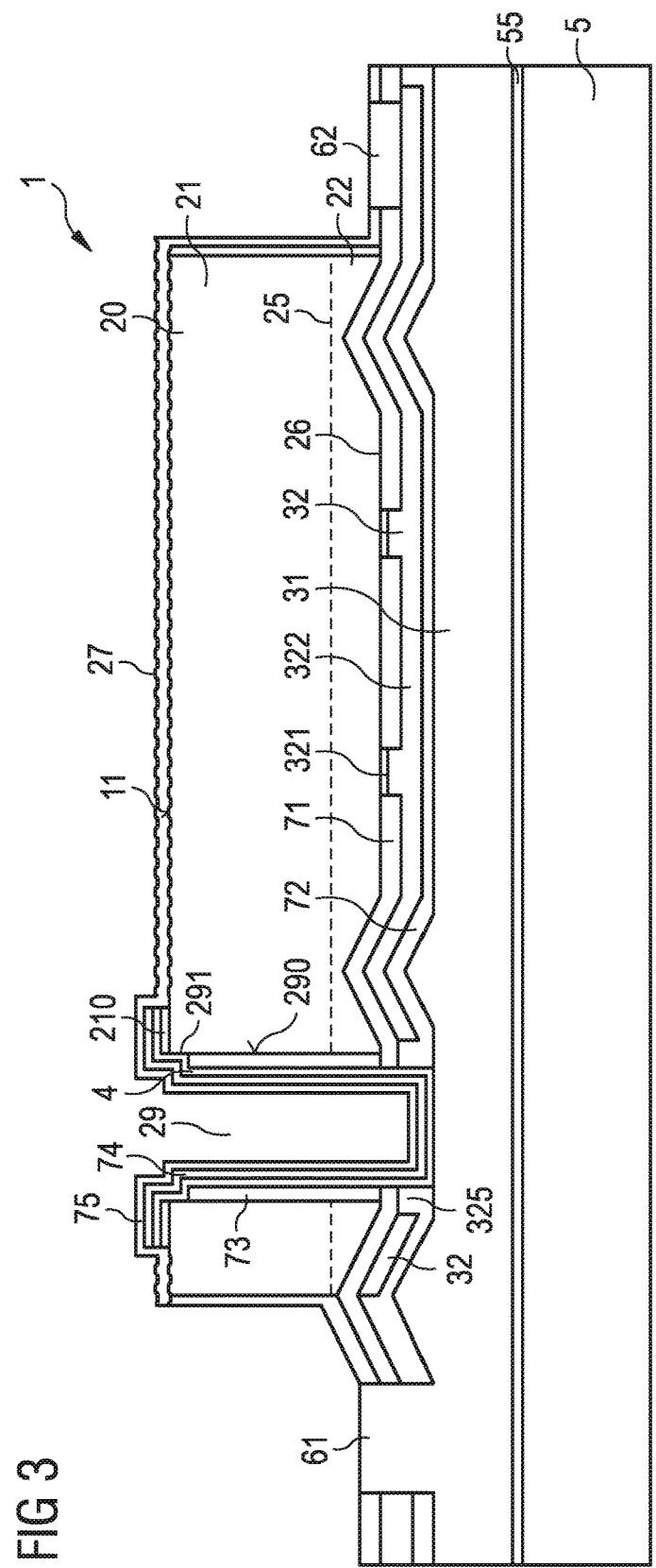

rating into the plurality of semiconductor components, wherein a semiconductor body (20) having at least one of the plurality of cut-outs arises from the semiconductor layer sequence for each semiconductor component and the at least one cut-out is completely surrounded by the semiconductor body in a top view of the semiconductor body. Furthermore, a semiconductor component is provided.

21 Claims, 17 Drawing Sheets

(51) Int. Cl.
| | |
|---|---|
| H01L 33/00 | (2010.01) |
| H01L 33/38 | (2010.01) |
| H01L 31/0352 | (2006.01) |
| H01L 31/0693 | (2012.01) |
| H01L 31/0735 | (2012.01) |
| H01L 31/056 | (2014.01) |
| H01L 23/544 | (2006.01) |
| H01L 31/0304 | (2006.01) |
| H01L 33/06 | (2010.01) |
| H01L 33/30 | (2010.01) |
| H01L 33/32 | (2010.01) |
| H01L 33/42 | (2010.01) |

(52) U.S. Cl.
CPC ............ *H01L 31/022466* (2013.01); *H01L 31/03046* (2013.01); *H01L 31/03048* (2013.01); *H01L 31/035236* (2013.01); *H01L 31/035281* (2013.01); *H01L 31/056* (2014.12); *H01L 31/0693* (2013.01); *H01L 31/0735* (2013.01); *H01L 31/186* (2013.01); *H01L 33/0079* (2013.01); *H01L 33/0095* (2013.01); *H01L 33/06* (2013.01); *H01L 33/30* (2013.01); *H01L 33/32* (2013.01); *H01L 33/382* (2013.01); *H01L 33/42* (2013.01); *H01L 2223/5446* (2013.01); *H01L 2933/0016* (2013.01); *Y02E 10/52* (2013.01); *Y02E 10/544* (2013.01); *Y02P 70/521* (2015.11)

(58) Field of Classification Search
CPC ....... H01L 31/022466; H01L 31/03046; H01L 31/03048; H01L 31/035236; H01L 31/035281; H01L 31/056; H01L 31/0693; H01L 31/0735; H01L 31/186; H01L 31/1892; H01L 33/0079; H01L 33/0095; H01L 33/06; H01L 33/30; H01L 33/32; H01L 33/382; H01L 33/42; H01L 33/0075; H01L 33/22; H01L 31/03044; H01L 31/02366; H01L 31/02363; H01L 31/02002; H01L 31/022408; H01L 31/022441; H01L 51/0018; H01L 51/0023; H01L 2224/26; H01L 2224/83851; H01L 21/76802; H01L 21/86877; H01L 21/76898; H01L 21/76852; H01L 21/76865; H01L 21/31608; H01L 21/3185; H01L 21/3141; H01L 21/28575; H01L 21/32051; H01L 21/0274; H01L 21/312; H01L 21/31116; H01L 21/31144; H01L 21/32136; H01L 21/32139; H01L 21/7806; H01L 21/3043; H01L 21/30612; H01L 21/3065; H01L 21/30625; Y02E 10/52; Y02E 10/544; C23F 1/00
See application file for complete search history.

(56) References Cited

U.S. PATENT DOCUMENTS

| | | | | |
|---|---|---|---|---|
| 5,858,824 | A * | 1/1999 | Saitoh | H01L 21/0332 257/E21.035 |
| 6,388,322 | B1 * | 5/2002 | Goossen | H01L 21/6835 257/737 |
| 6,503,770 | B1 * | 1/2003 | Ho | H01S 5/2231 438/22 |
| 7,625,805 | B2 * | 12/2009 | Lerner | H01L 21/76224 257/E21.546 |
| 7,795,144 | B2 | 9/2010 | Hirao | |
| 8,368,102 | B2 | 2/2013 | Fujimoto et al. | |
| 8,471,241 | B2 | 6/2013 | Choi et al. | |
| 8,653,540 | B2 | 2/2014 | Engl et al. | |
| 8,748,903 | B2 | 6/2014 | Kamei et al. | |
| 8,975,102 | B2 * | 3/2015 | Gebuhr | H01L 33/62 257/99 |
| 8,987,763 | B2 | 3/2015 | Aoyagi et al. | |
| 9,054,487 | B2 * | 6/2015 | Avramescu | H01S 5/02461 |
| 9,209,368 | B2 * | 12/2015 | Sabathil | H01L 33/62 |
| 9,219,194 | B2 | 12/2015 | Shi et al. | |
| 9,299,897 | B2 * | 3/2016 | Hoppel | H01L 33/0016 |
| 9,620,680 | B2 | 4/2017 | Engl et al. | |
| 9,627,588 | B2 * | 4/2017 | Hoppel | H01L 33/382 |
| 2002/0053676 | A1 * | 5/2002 | Kozaki | B82Y 20/00 257/88 |
| 2002/0059903 | A1 * | 5/2002 | Hasegawa | C23C 14/042 118/504 |
| 2002/0074556 | A1 * | 6/2002 | Kwak | B82Y 20/00 257/79 |
| 2003/0231684 | A1 * | 12/2003 | Yagi | H01S 5/22 372/46.01 |
| 2005/0056855 | A1 * | 3/2005 | Lin | H01L 33/382 257/98 |
| 2005/0069813 | A1 * | 3/2005 | Sawada | G03F 7/40 430/311 |
| 2005/0158900 | A1 * | 7/2005 | Lee | G02F 1/136286 438/30 |
| 2006/0039429 | A1 * | 2/2006 | Choi | B82Y 20/00 372/43.01 |
| 2006/0086960 | A1 * | 4/2006 | Arai | H01L 27/10852 257/303 |
| 2006/0108593 | A1 * | 5/2006 | Kim | H01L 33/46 257/94 |
| 2006/0138426 | A1 * | 6/2006 | Yoo | G02F 1/134363 257/72 |
| 2006/0240338 | A1 * | 10/2006 | Satoh | H01L 21/76838 430/5 |
| 2007/0107772 | A1 * | 5/2007 | Meck | H01L 27/142 136/255 |
| 2008/0042134 | A1 * | 2/2008 | Jung | G02F 1/1368 257/59 |
| 2008/0048194 | A1 * | 2/2008 | Kudo | H01L 33/32 257/94 |
| 2008/0185038 | A1 * | 8/2008 | Sharps | H01L 31/022425 136/255 |
| 2008/0217046 | A1 * | 9/2008 | Tang | H01L 23/49811 174/257 |
| 2008/0308823 | A1 * | 12/2008 | Kamii | H01L 27/15 257/94 |
| 2009/0161711 | A1 * | 6/2009 | Kubota | B82Y 20/00 372/43.01 |
| 2009/0194784 | A1 * | 8/2009 | Kaji | H01L 33/16 257/103 |
| 2009/0219966 | A1 * | 9/2009 | Tan | B82Y 20/00 372/43.01 |
| 2009/0242943 | A1 * | 10/2009 | Kawasaki | H01L 29/7786 257/279 |
| 2009/0283795 | A1 * | 11/2009 | Miki | H01L 21/0237 257/103 |
| 2010/0059476 | A1 * | 3/2010 | Yamamoto | G11B 5/855 216/22 |
| 2010/0065869 | A1 * | 3/2010 | Arai | H01L 33/0079 257/98 |

(56) References Cited

U.S. PATENT DOCUMENTS

| | | | |
|---|---|---|---|
| 2010/0096621 A1* | 4/2010 | Chuman | H01L 51/001 257/40 |
| 2010/0126573 A1* | 5/2010 | Youtsey | H01L 31/02244 136/255 |
| 2010/0186804 A1* | 7/2010 | Cornfeld | H01L 31/02021 136/255 |
| 2010/0218816 A1* | 9/2010 | Guha | H01L 31/0682 136/256 |
| 2010/0276706 A1* | 11/2010 | Herrmann | H01L 33/0079 257/89 |
| 2010/0276722 A1* | 11/2010 | Baur | H01L 24/24 257/99 |
| 2011/0024781 A1* | 2/2011 | Fujimoto | H01L 33/20 257/98 |
| 2011/0250713 A1* | 10/2011 | Kawasaki | H01L 29/458 438/34 |
| 2012/0007118 A1* | 1/2012 | Choi | H01L 33/382 257/98 |
| 2012/0018734 A1* | 1/2012 | Chae | H01L 33/382 257/76 |
| 2012/0018764 A1* | 1/2012 | Choi | H01L 33/54 257/99 |
| 2012/0043572 A1* | 2/2012 | Engl | H01L 33/382 257/98 |
| 2012/0153254 A1* | 6/2012 | Mastro | H01L 33/40 257/13 |
| 2012/0153417 A1* | 6/2012 | Shi | H01L 31/105 257/432 |
| 2012/0189029 A1* | 7/2012 | Kashiwagi | B82Y 20/00 372/44.011 |
| 2013/0020589 A1* | 1/2013 | Yu | H01L 33/0079 257/88 |
| 2013/0187192 A1* | 7/2013 | Hoeppel | H01L 31/02005 257/99 |
| 2013/0221398 A1* | 8/2013 | Kim | H01L 33/382 257/99 |
| 2013/0228744 A1* | 9/2013 | Kazama | H01L 33/382 257/13 |
| 2013/0256735 A1 | 10/2013 | Kim | |
| 2013/0263920 A1* | 10/2013 | Fidaner | H01L 31/022441 136/255 |
| 2013/0292719 A1* | 11/2013 | Lee | H01L 33/08 257/93 |
| 2013/0292735 A1* | 11/2013 | Hoppel | H01L 23/49827 257/99 |
| 2014/0030868 A1* | 1/2014 | Parthasarathy | H01L 21/76224 438/430 |
| 2014/0235005 A1* | 8/2014 | Lee | H01L 21/0254 438/46 |
| 2014/0248758 A1* | 9/2014 | Weiss | B23K 26/38 438/463 |
| 2014/0283903 A1* | 9/2014 | von Malm | H01L 31/02363 136/255 |
| 2014/0315134 A1* | 10/2014 | Bang | G03F 7/0035 430/324 |
| 2014/0361327 A1* | 12/2014 | Chae | H01L 33/22 257/98 |
| 2015/0017759 A1* | 1/2015 | Hirobe | C23C 14/24 438/99 |
| 2015/0108514 A1* | 4/2015 | Shi | H01L 33/145 257/88 |
| 2015/0144974 A1* | 5/2015 | Chen | H01L 27/15 257/93 |
| 2015/0155442 A1* | 6/2015 | Chien | H01L 33/405 257/98 |
| 2015/0333047 A1* | 11/2015 | Pfeuffer | H01L 25/0753 257/88 |
| 2016/0149075 A1* | 5/2016 | Atanackovic | H01L 33/06 257/13 |
| 2016/0172547 A1* | 6/2016 | von Malm | H01L 33/0095 257/98 |
| 2016/0204305 A1* | 7/2016 | Chiu | H01L 25/0753 257/94 |
| 2016/0204374 A1* | 7/2016 | Sonoda | H01L 51/5256 257/40 |
| 2016/0225953 A1* | 8/2016 | Meitl | H01L 33/465 |
| 2016/0233368 A1* | 8/2016 | Ogane | H01L 31/0747 |
| 2017/0062351 A1* | 3/2017 | Von Malm | H01L 31/02245 |
| 2017/0069843 A1* | 3/2017 | Kang | H01L 51/0011 |
| 2017/0125634 A1* | 5/2017 | Choi | H01L 33/06 |

FOREIGN PATENT DOCUMENTS

| | | | | |
|---|---|---|---|---|
| DE | 10 2008 051 048 A1 | 4/2010 | | |
| DE | 102008053731 A1 | 5/2010 | | |
| DE | 102009030243 A1 | 5/2010 | | |
| DE | 10 2008 062 833 A1 | 7/2010 | | |
| DE | 102011115659 A1 * | 3/2013 | | H01L 31/02363 |
| DE | 102011056888 A1 | 6/2013 | | |
| DE | 102012106953 A1 | 1/2014 | | |
| DE | 102012107921 A1 | 3/2014 | | |
| JP | H07-86691 A | 3/1995 | | |
| JP | H10-4102 A | 1/1998 | | |
| JP | 2008-305874 A | 12/2008 | | |
| JP | 2010525585 A | 7/2010 | | |
| JP | 2011035017 A | 2/2011 | | |
| JP | 2011-100824 A | 5/2011 | | |
| JP | 2011223000 A | 11/2011 | | |
| JP | 2012-505531 A | 3/2012 | | |
| JP | 2013157496 A | 8/2013 | | |
| WO | WO-2013/189949 A1 | 12/2013 | | |
| WO | WO-2014018273 A1 | 1/2014 | | |

* cited by examiner

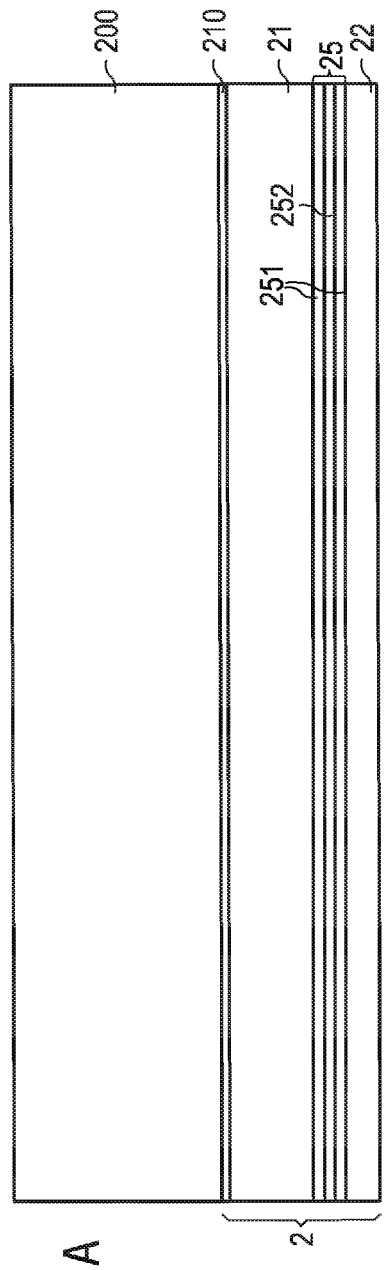
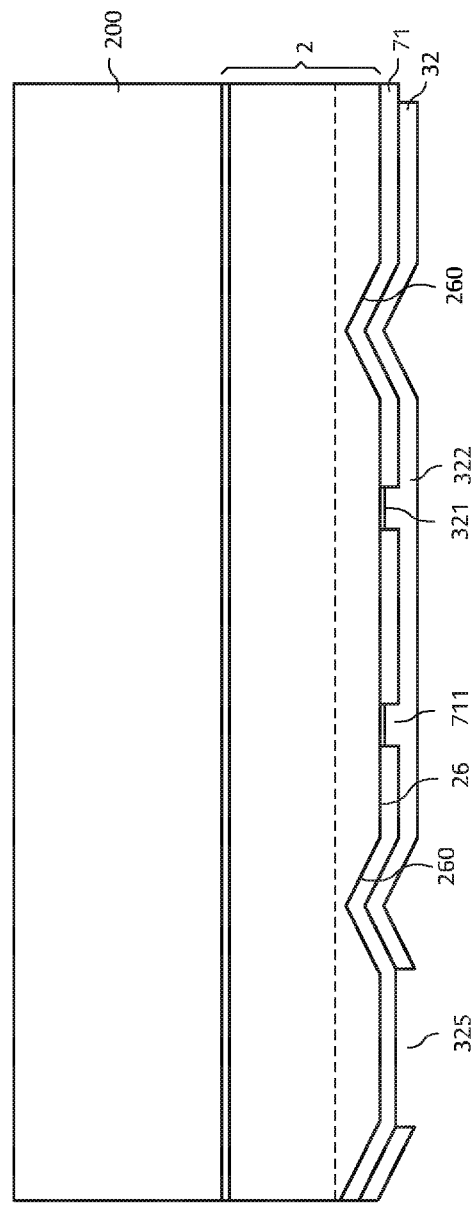

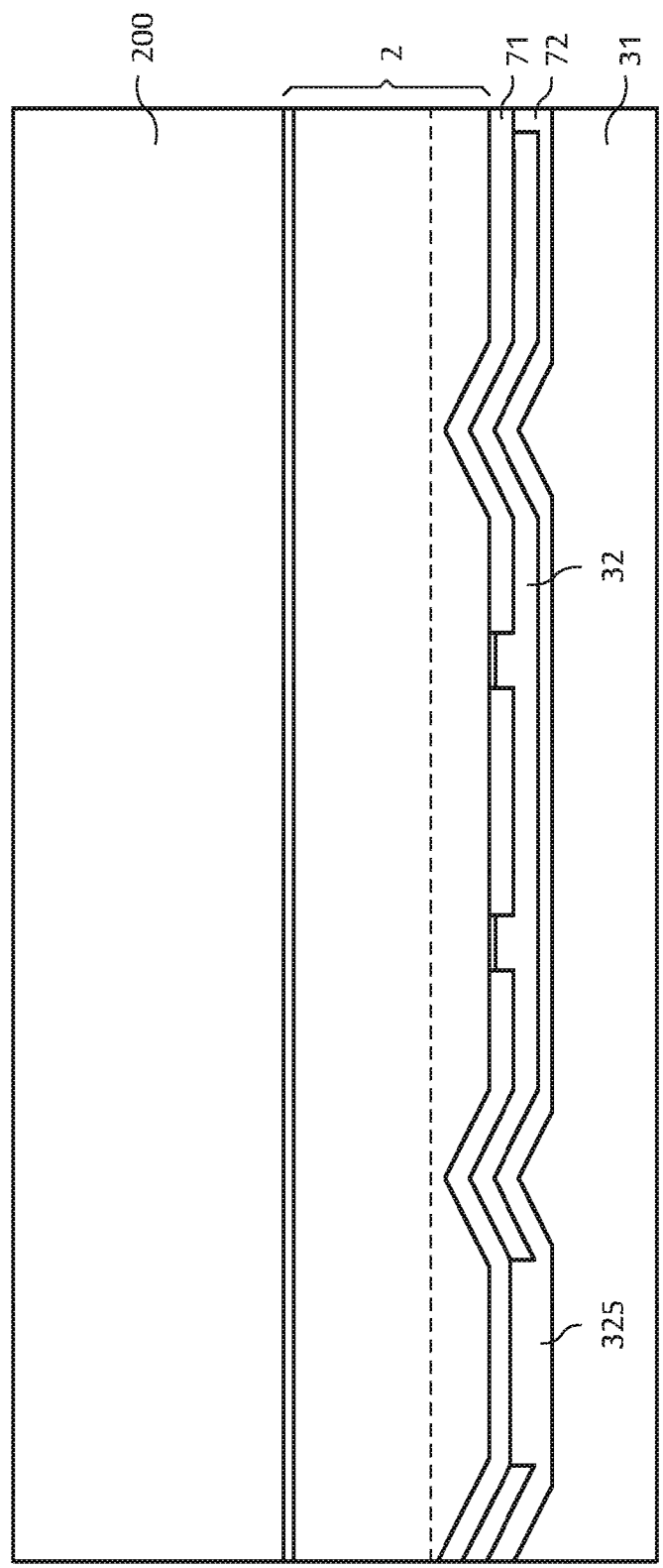

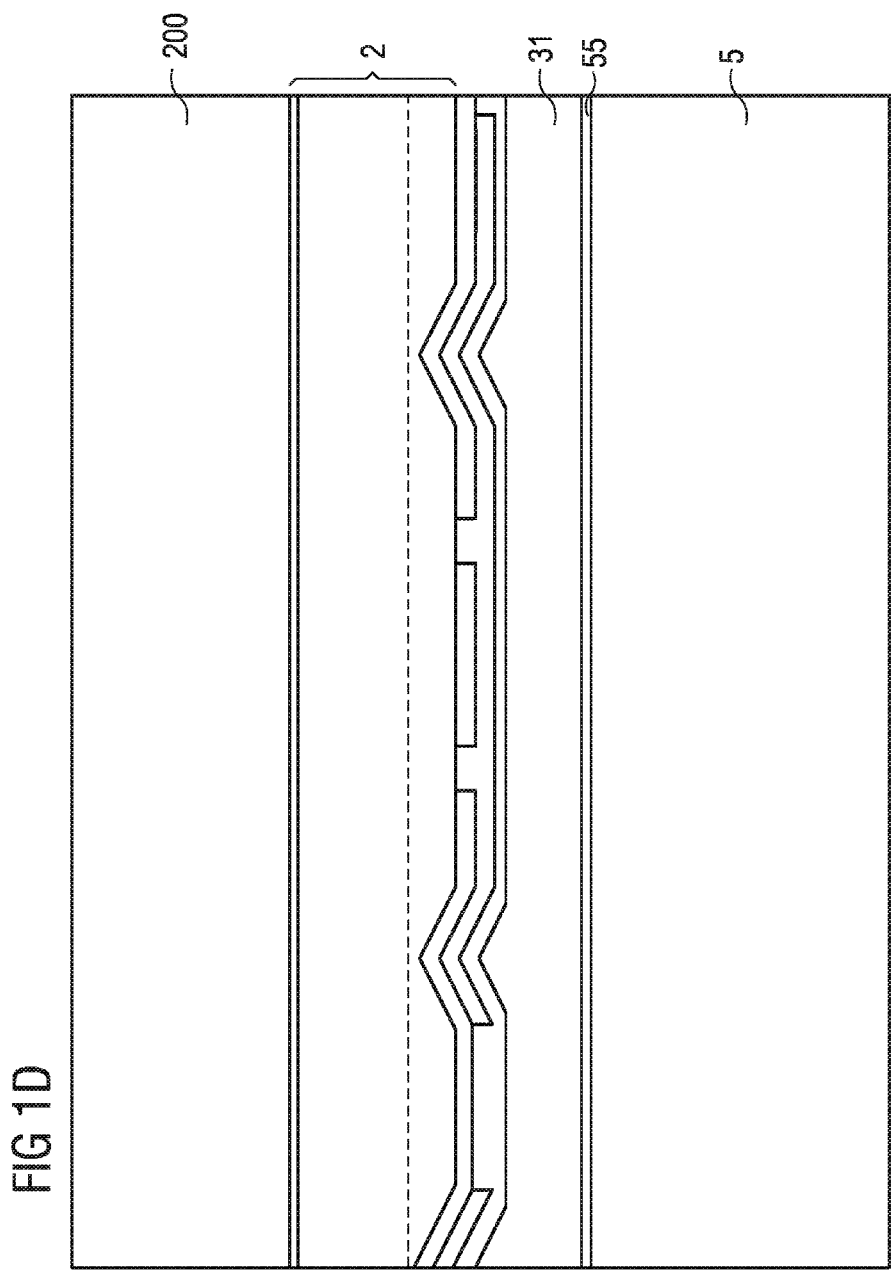

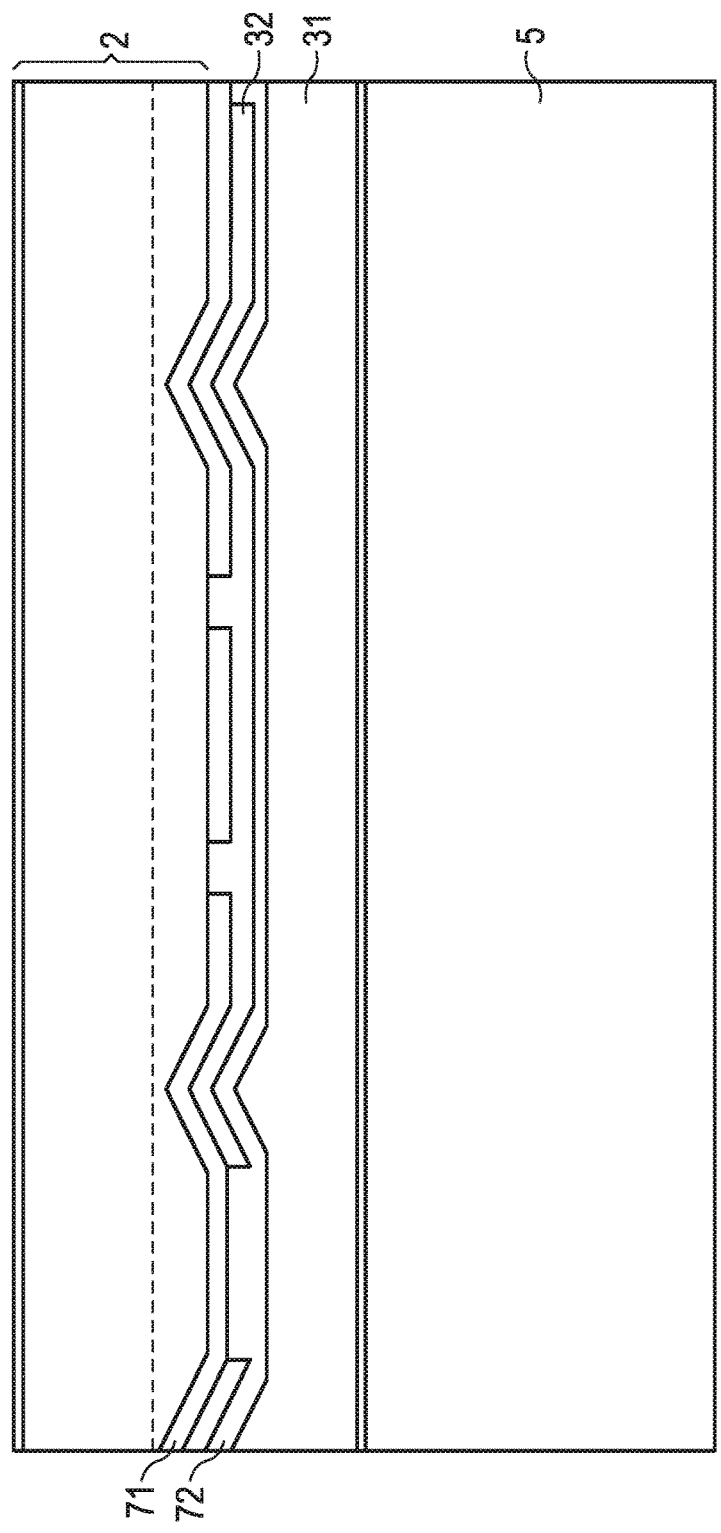

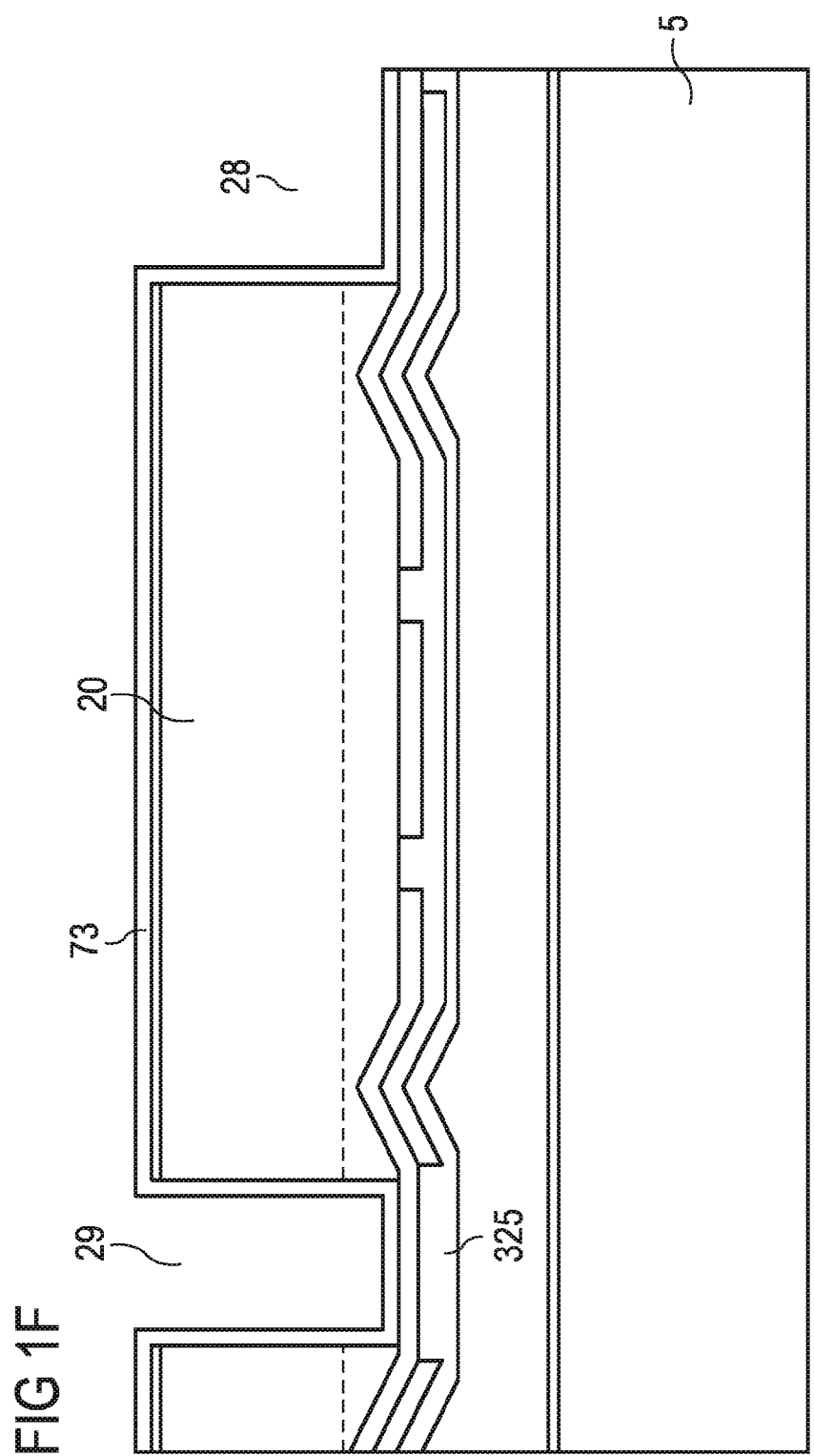

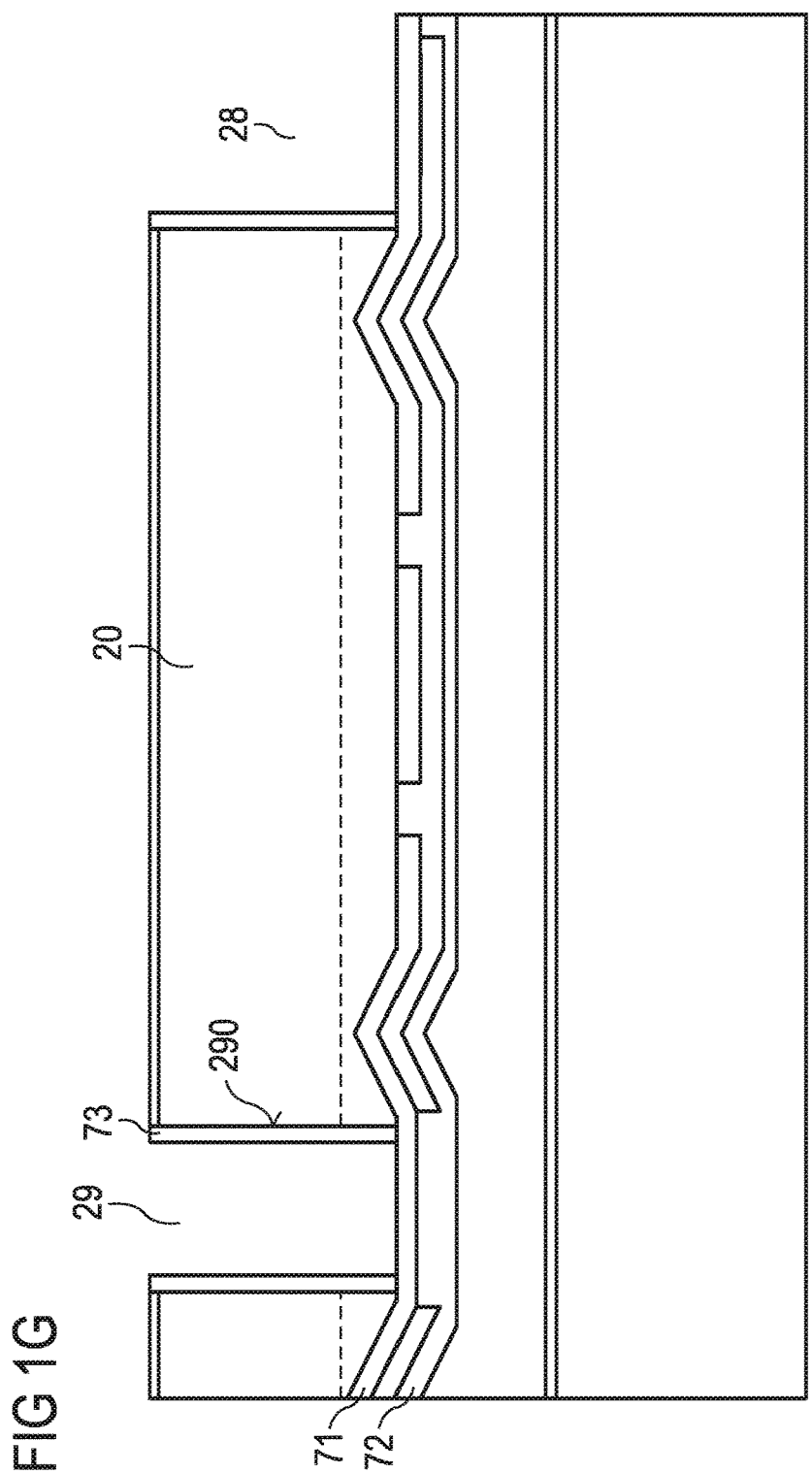

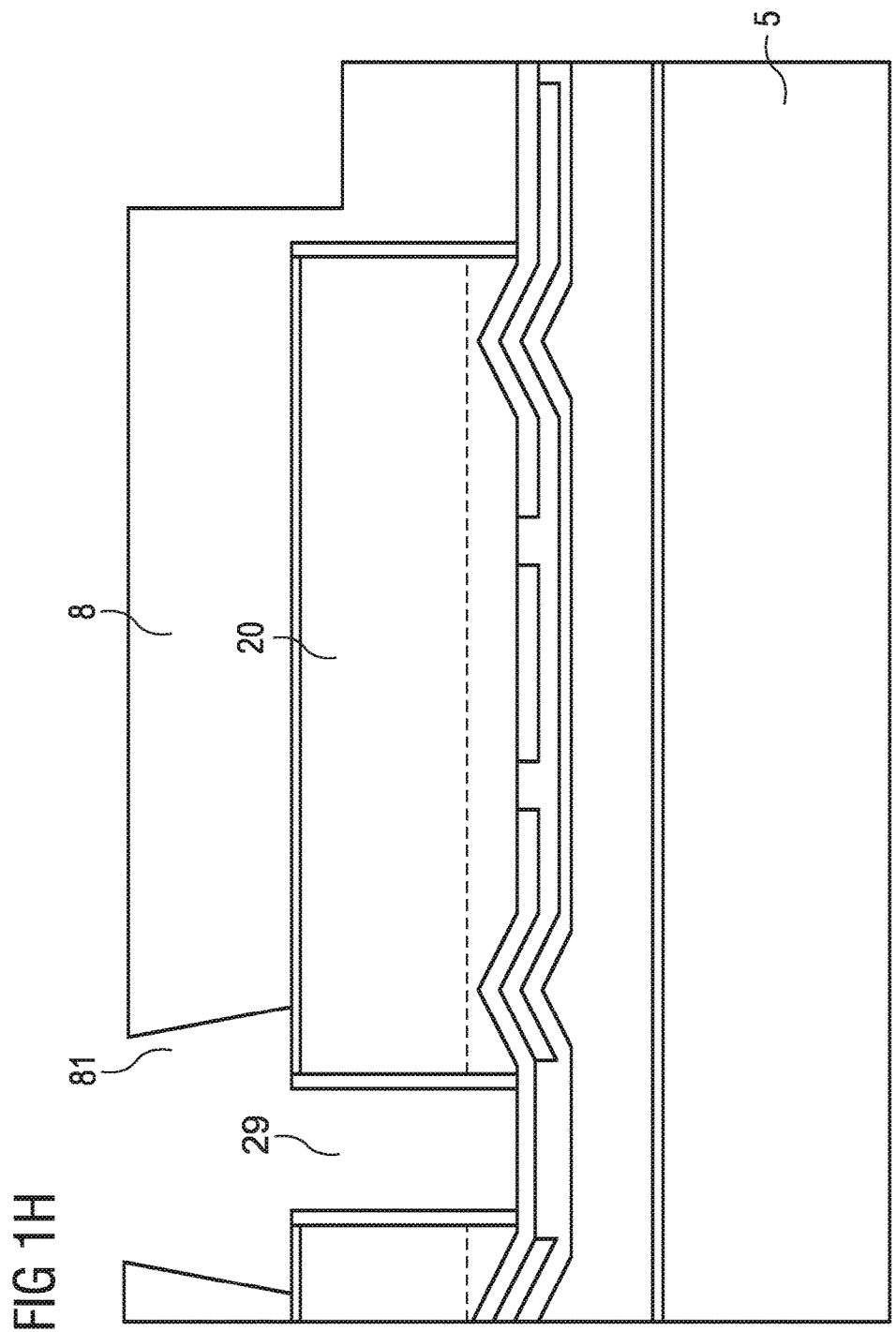

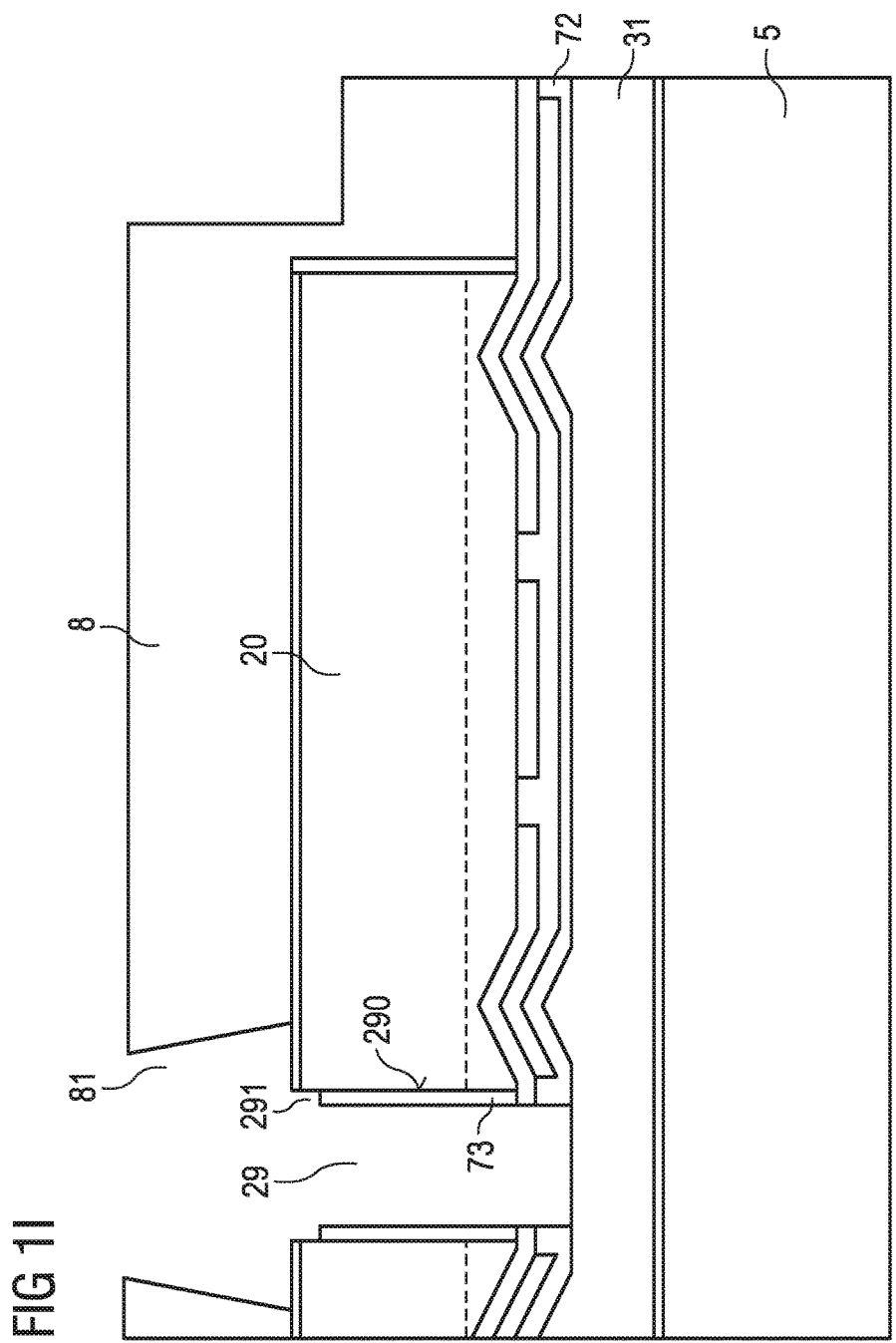

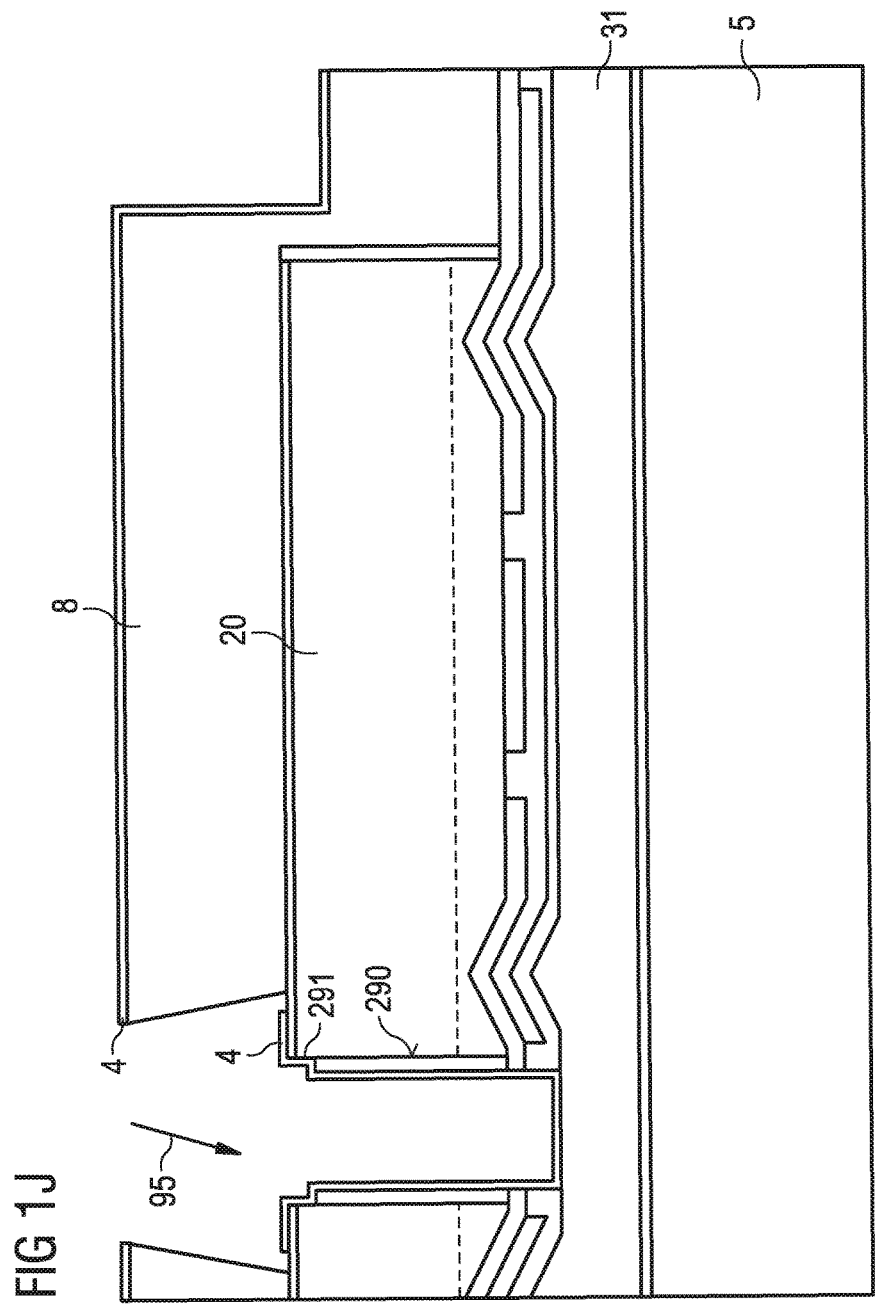

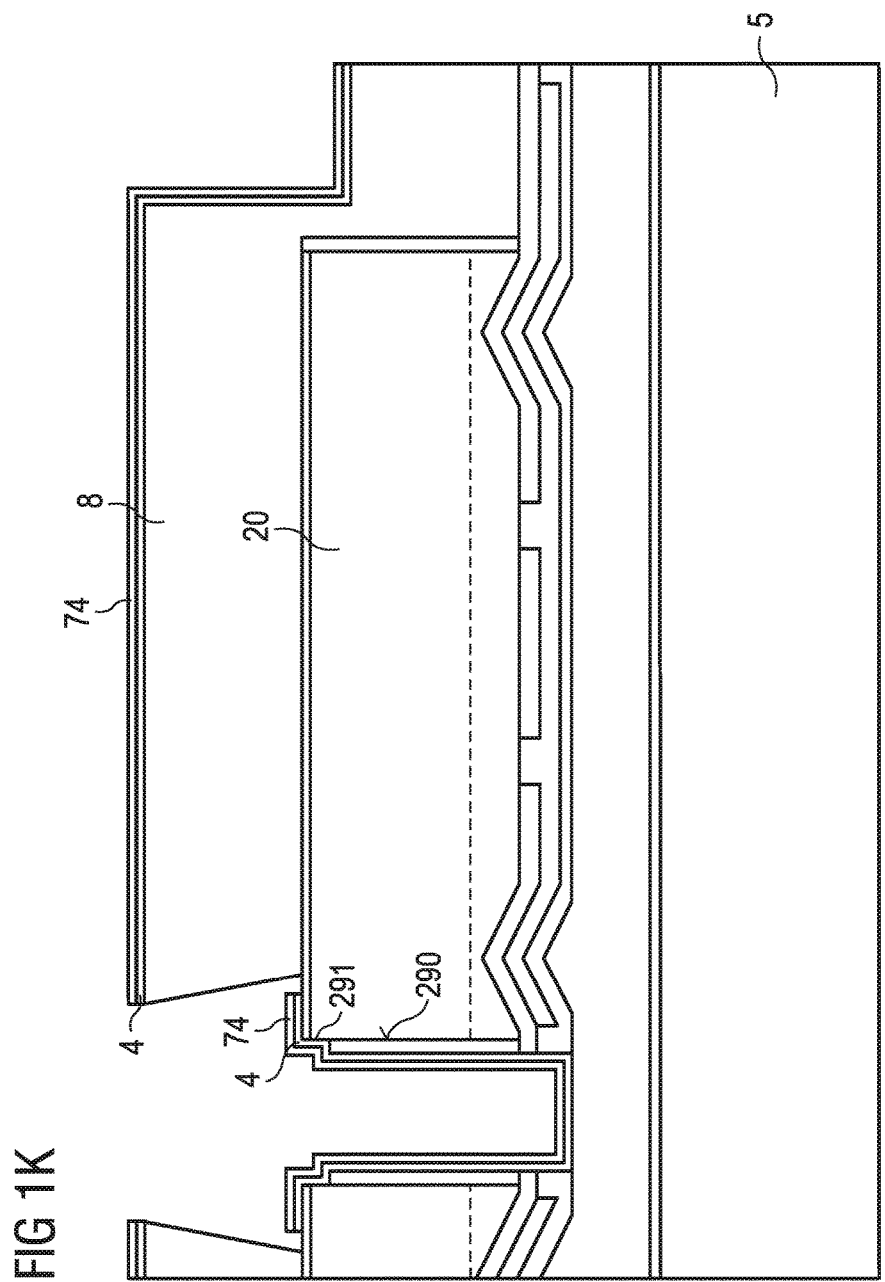

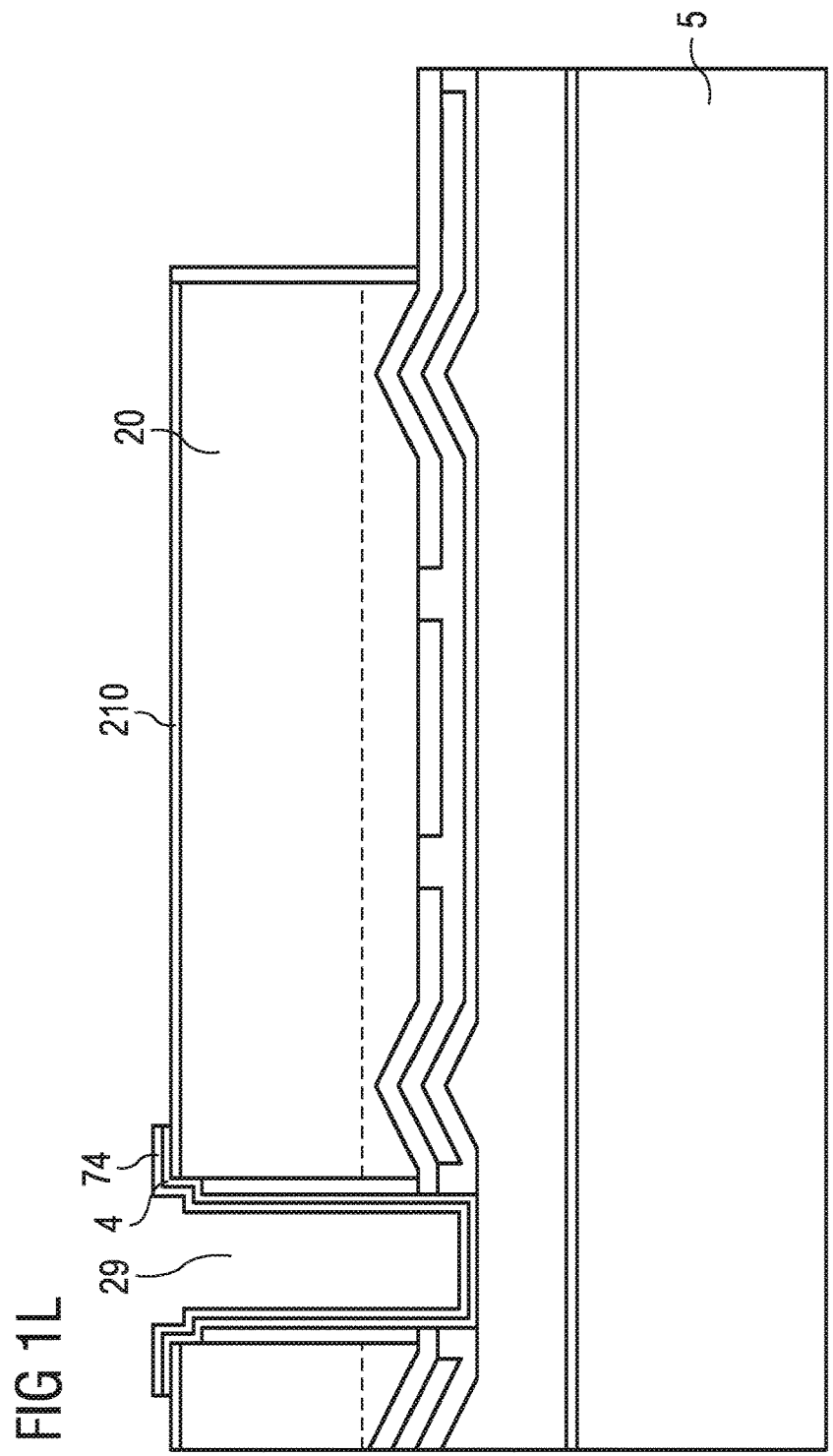

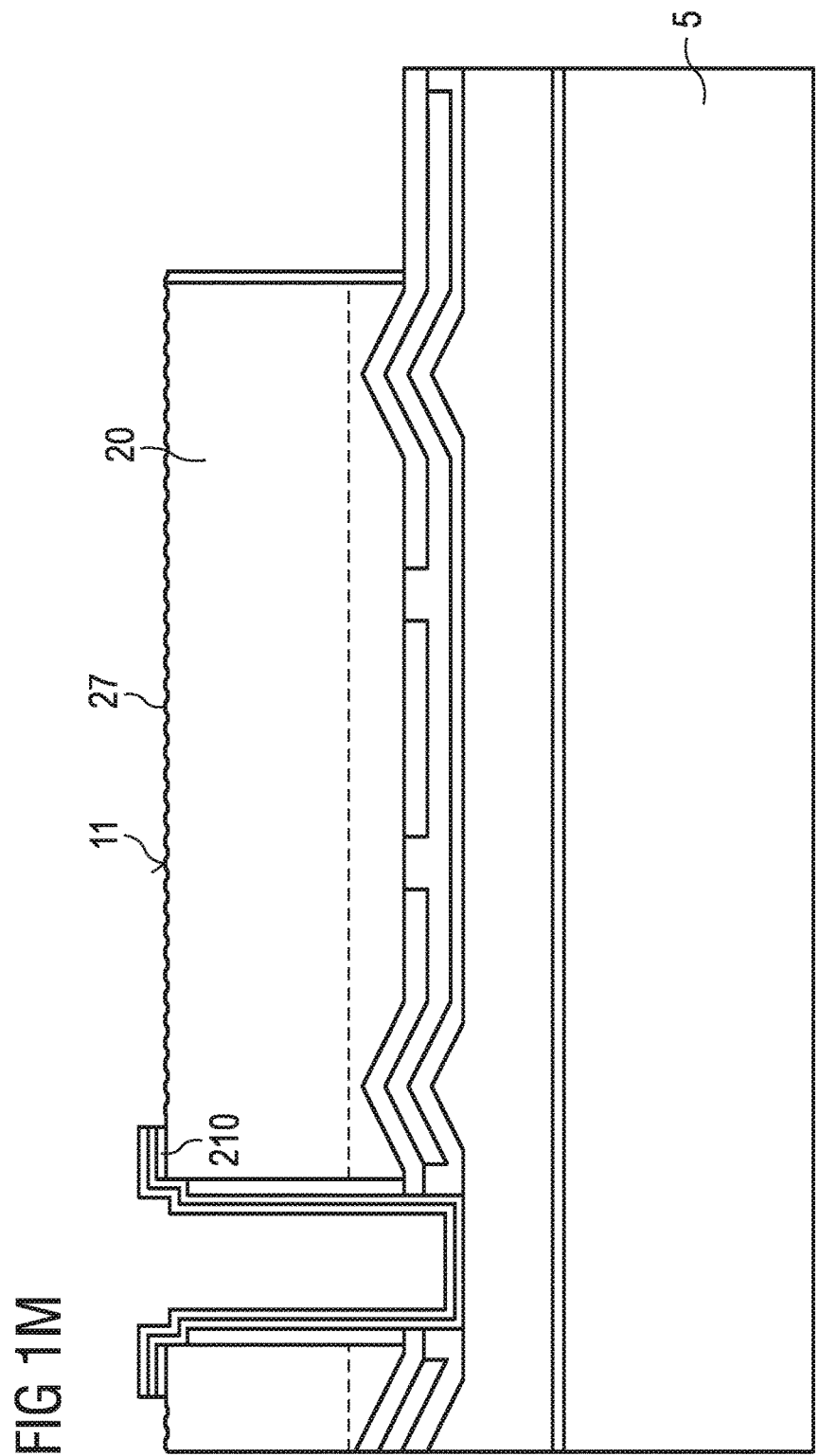

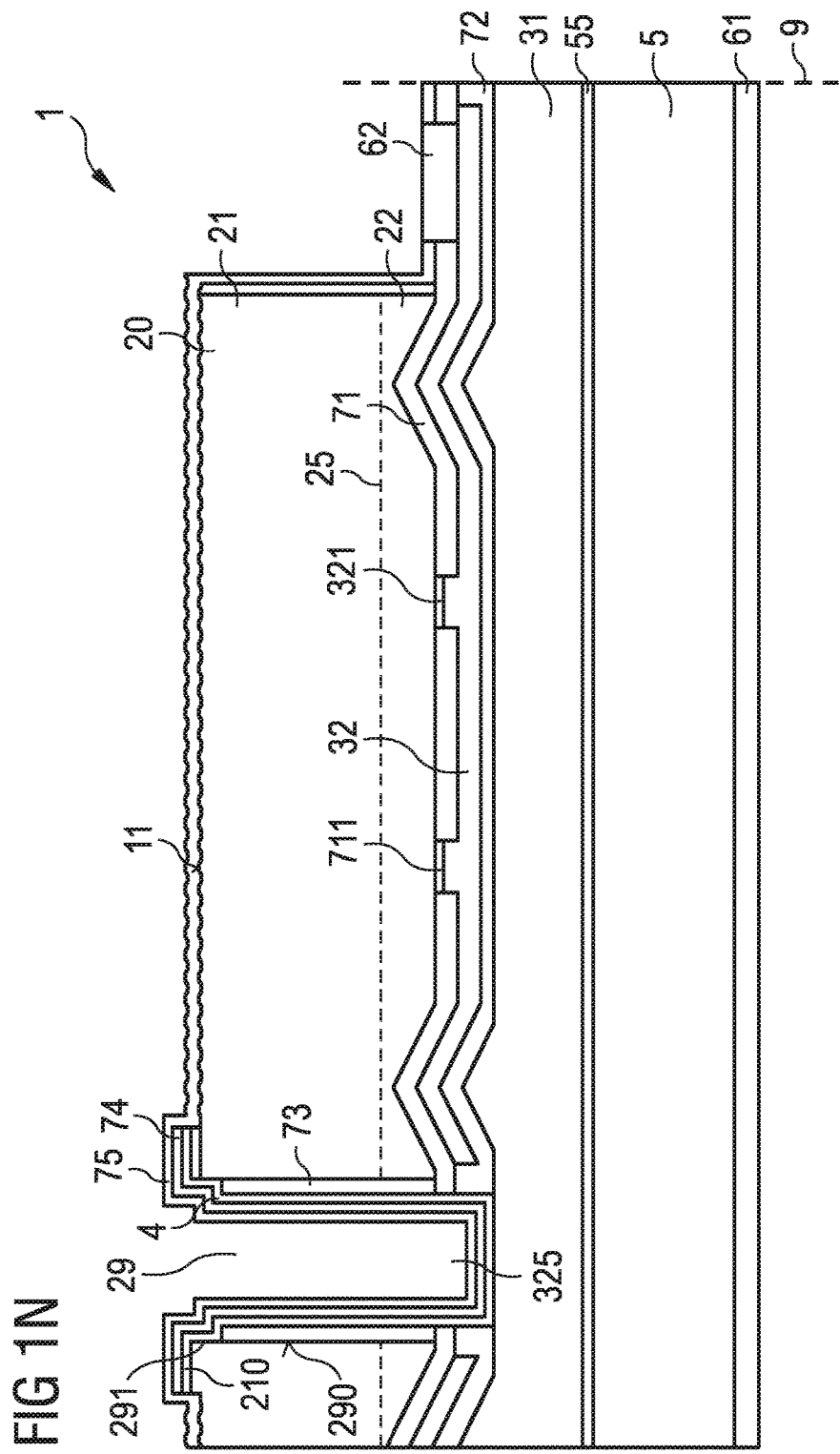

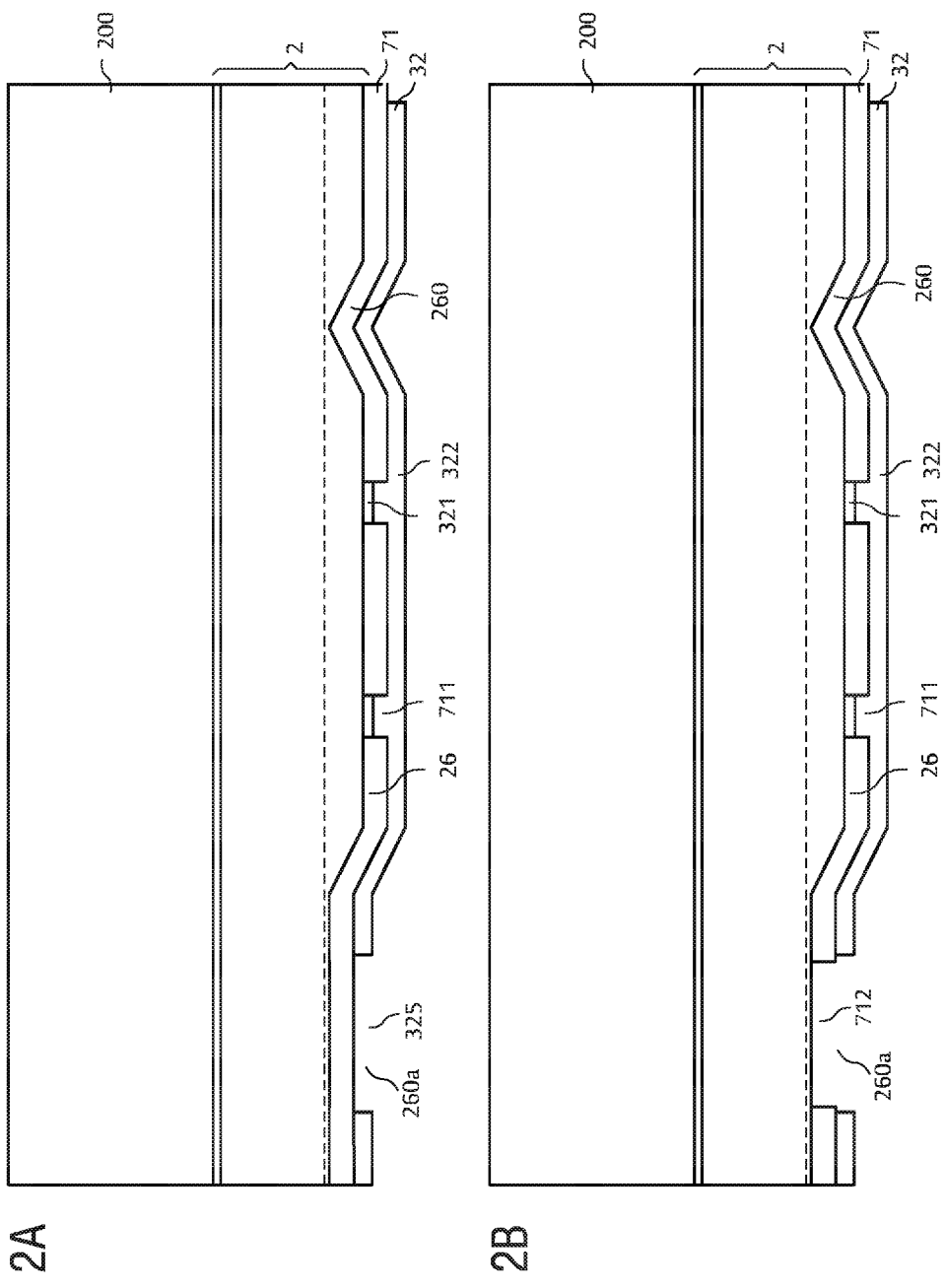

METHOD FOR PRODUCING SEMICONDUCTOR COMPONENTS AND SEMICONDUCTOR COMPONENT

The present application relates to a method for producing semiconductor components and a semiconductor component.

In optoelectronic semiconductor components, such as light diodes on the basis of gallium arsenide or indium phosphide, for example, metal grids are often used on the radiation exit side for current spreading, electrical contact and current injection. However, the latter cause shading within sections as well as inhomogeneities in the current impression and the light emission, thus reducing efficiency.

One object is to provide a method by means of which semiconductor components that are distinguished by increased efficiency can be produced in a simple and reliable manner. Furthermore, a semiconductor component with an increased efficiency is to be provided.

Said object is achieved, inter alia, by the subject of the independent claims. Embodiments and developments are the subject of the dependent claims.

A method for producing a plurality of in particular optoelectronic semiconductor components is provided.

According to at least one embodiment, the method comprises a step in which a semiconductor layer sequence is provided. Said semiconductor layer sequence in particular comprises an active region provided for generating and/or receiving radiation. In a semiconductor chip provided for generating radiation the active region preferably has a quantum structure. Within the scope of the application, the designation quantum structure comprises in particular any structure in which charge carriers can experience a quantization of their energy states due to confinement. In particular, the designation "quantum structure" does not include any indication regarding the dimensionality of the quantization. It thus comprises, inter alia, quantum well, quantum wires and quantum dots and any combination of said structures. For example, the active region can comprise a multiple quantum structure with a plurality of quantum layers, wherein in each case a barrier layer is arranged between adjacent quantum layers.

Furthermore, the semiconductor layer sequence comprises a first semiconductor layer and a second semiconductor layer, for example, wherein the active region is arranged between the first semiconductor layer and the second semiconductor layer. For reasons of expediency, the first semiconductor layer and the second semiconductor layer are at least partially different from each other with regard to the conductivity type. For example, the first semiconductor layer is n-type-conducting and the second semiconductor layer is p-type-conducting or vice versa.

According to at least one embodiment, the method comprises a step in which a first connection layer is formed on the side of the second semiconductor layer facing away from the first semiconductor layer. The first connection layer is formed in particular after concluding the for example epitaxial deposition of the semiconductor layer sequence, for instance by means of sputtering or vaporization. Thus, the first connection layer is arranged outside the semiconductor layer.

According to at least one embodiment, the method comprises a step in which a plurality of cut-outs are formed through the semiconductor layer sequence. The cut-outs extend completely through the semiconductor layer sequence in a vertical direction running perpendicular to a main extension plane of the semiconductor layers of the semiconductor layer sequence. The removal of material from the semiconductor layer sequence can also ensue in separate production steps of two sides of the semiconductor layer sequence situated opposite to each other. In particular, material of the semiconductor layer sequence can be removed in the later region of the cut-outs even before the first connection layer has been applied.

According to at least one embodiment, the method comprises a step in which a conducting layer is formed in the cut-outs. Said conducting layer is in particular provided for producing an electrically conductive connection between the first semiconductor layer and the first connection layer. For example, the conducting layer is at least partially immediately adjacent to the first connection layer, in particular in the cut-outs.

According to at least one embodiment, the method comprises a step in which a singulation into a plurality of semiconductor components ensues. In particular, a semiconductor body with at least one of a plurality of cut-outs arises from the semiconductor layer sequence for each semiconductor component. The at least one cut-out is completely surrounded by the semiconductor body in a top view of the semiconductor body. In other words, material of the semiconductor layer sequence is formed along the entire circumference of the cut-out. The cut-outs are thus not located at the edge of the semiconductor bodies.

Before singulation, the semiconductor layer sequence can already be split into individual semiconductor bodies, for example by means of isolation trenches, which limit the individual semiconductor bodies in lateral direction. The isolation trenches can be formed in a joint step with the cut-outs. Alternatively conceivable is that the cut-outs and the isolation trenches are formed in successive production steps. The formation of the cut-outs and/or the isolation trenches ensues, for example, by means of wet-chemical or dry-chemical etching. Furthermore, the semiconductor layer sequence can also not be split into individual semiconductor bodies until the singulation takes place.

In at least one embodiment of the method, a semiconductor layer sequence with a first semiconductor layer, a second semiconductor layer and an active region arranged between the first semiconductor layer and the second semiconductor layer for generating and/or receiving radiation. A first connection layer is formed on the side of the second semiconductor layer facing away from the first semiconductor layer. A plurality of cut-outs is formed through the semiconductor layer sequence. A conducting layer is formed in the cut-outs for producing an electrically conductive connection between the first semiconductor layer and the first connection layer. A singulation into the plurality of semiconductor components ensues, wherein a semiconductor body with at least one of a plurality of cut-outs arises from the semiconductor layer sequence and the at least one cut-out is completely surrounded by the semiconductor body in a top view of the semiconductor body.

By means of the cut-outs and the conducting layer arranged therein, an electrical contact of the first semiconductor layer of the side of the semiconductor layer sequence facing away from the first semiconductor layer. A metal grid on the first semiconductor layer for current spreading and electrically contacting the first semiconductor layer can be waived.

Each of the semiconductor bodies can comprise more than one cut-out. In the event of a radiation-emitting component, this allows an in lateral direction homogenous charge carrier injection to ensue in a more simplified manner. In the event of a radiation receiver with a plurality of cut-outs, the path length in the semiconductor body decreases for the charge carrier generated by radiation absorption in the active region, before the latter can reach the first connection layer.

According to at least one embodiment of the method, a growth substrate for semiconductor layer sequence is removed before the formation of the plurality of cut-outs. The growth substrate can, for example, ensue by means of a mechanical and/or a chemical method. Alternatively or additionally, a laser peeling method can ensue. For example, the removal of the growth substrate ensues between the formation of the first connection layer and the formation of the plurality of cut-outs. A semiconductor component from which the growth substrate is removed, is also designated as thin-film semiconductor component.

According to at least one embodiment, the method comprises a step in which a separating layer is applied for electrical insulation between the active region and the conducting layer, said separating layer covering the lateral surfaces of the cut-outs at least on the level of the second semiconductor layer and of the active region.

The electrical insulation between the semiconductor layer sequence and the conducting layer can, however, also ensue without separating layer, for example by an air gap, by a Schottky contact, by the embodiment of a contact with ohmic characteristic and a high contact resistance, or by a targeted local change of the doping of the semiconductor layer sequence, for instance by ion implantation.

In particular, material for the separating layer is applied to the entire semiconductor layer sequence with the cut-outs for forming said separating layer. In deviation to an all-over deposition of the material for the separating layer, it is also conceivable that the material is only applied in sections, in particular in the area of the cut-outs.

The material, in particular applied to the entire surface, can subsequently be removed in such a way by means of a directionally selective etching method that only surfaces running obliquely or perpendicularly to the main extension plane of the semiconductor layers, in particular the lateral sides of the cut-outs, remain covered by the separating layer.

In particular, the material of the separating layer is completely exposed to the etching method. Unlike conventional methods, no mask is thus used by means of which the areas from which material of the separating layer is removed and the areas in which material of the separating layer remains on the semiconductor layer sequence are defined.

The directionally selective etching method has in particular a higher etching rate in a vertical direction than in a lateral direction. For example, a dry-chemical etching method, such as reactive ion etching, is suitable as directionally selective etching method.

For example, the etching rate in a vertical direction is at least twice as high, preferably at least five times as high, as in a lateral direction.

In particular, after implementing the directionally selective etching method, a bottom surface of the cut-outs and a radiation passage surface formed by the first semiconductor layer is free from material of the separating layer or has an extremely reduced thickness, at least compared with the lateral surfaces of the cut-outs, for example a maximum of 20% of the thickness of the layer on the lateral surfaces of the cut-outs.

According to at least one embodiment of the method, in a subsequent further directionally selective etching method, further material of the separating layer is removed and the first semiconductor layer in the cut-outs is partially exposed. In particular, the semiconductor layer can be exposed in a partial area of the lateral surfaces of the cut-outs. For example, the partial area is adjacent to the radiation passage surface. The material of the separating layer on the radiation passage surface can be completely or only partially removed.

According to at least one embodiment of the method, the first connection layer is exposed by the further directionally selective etching method. Before the further directionally selective etching method, material arranged in a vertical direction between the semiconductor layer sequence and the first connection layer, in particular the material below a bottom surface of the cut-outs, is this completely removed in sections, and therefore the first connection layer is accessible. For example, the further directionally selective etching method removes dielectric material, in particular only dielectric material.

According to at least one embodiment of the method, before forming the cut-outs between the semiconductor layer sequence and the first connection layer, a first insulation layer with openings is formed, wherein the cut-outs are formed in such a way that they overlap with the openings in a top view of the semiconductor layer sequence. In particular, the cut-outs run through the semiconductor layer sequence completely within the openings in the first insulation layer. For the exposure of the first connection layer, it is thus not necessary to additionally remove the material of the insulation layer after forming the cut-outs through the semiconductor layer sequence. The openings can in particular be formed in the same production step as cut-outs of the insulation layer, through which an electrical contacting of the second semiconductor layer ensues.

According to at least one embodiment, the method comprises a step in which a masking layer with a plurality of openings is applied to the semiconductor layer sequence before applying the conducting layer and each cut-out is completely arranged within one of the plurality of openings in a top view. The first semiconductor layer is, for example, free of the masking layer in sections laterally relative to the cut-outs. A photoresist is, for example, suitable for the masking layer.

According to at least one embodiment of the method, the openings taper with increasing distance from the semiconductor layer sequence. Material for the conducting layer is in particular deposited with a main deposition direction, which runs obliquely to the vertical direction, such that material of the conducting layer deposited in the openings overlaps with material of the conducting layer deposited on the masking layer in a top view. Thus, material of the conducting layer in the openings partially covers the first semiconductor layer, in particular laterally relative to the cut-outs.

The formation of the conducting layer can also ensue in two or more sub-steps. For example, the conducting layer can be formed in such a way that the cut-outs are completely filled, for example by means of a galvanic deposition and, if need be, of a grinding back of the galvanically deposited material.

Furthermore, the conducting layer can also be deposited over the entire surface and, by means of a masking layer, subsequently locally removed from the areas not covered by the masking layer.

Moreover, a TCO (transparent conductive oxide) material can be used for the conducing layer. In such case, the conducting layer can also remain over a large area on the semiconductor layer sequence.

According to at least one embodiment of the method, a covering layer is applied to the conducting layer. Said covering layer in particular serves as mask for a subsequent material removal of the first semiconductor layer.

However, instead of one of the covering layers applied to the conducting layer, said conducting layer can itself serve as mask, in particular if the conducting layer has sufficient stability against the method for material removal. In the event of a dry-chemical removal method, for example a plasma etching method, for instance with a halogen-containing plasma, a conducting layer containing nickel, for example, is suitable as a hard mask. Alternatively, a wet-chemical method can be used, which does not attack or only insubstantially attacks the conducting layer.

The covering layer is in particular applied before removing the masking layer. The covering layer is thus applied both in openings of the masking layer as well as to the masking layer itself. After removing the masking layer, the covering layer remains only in areas not covered by the masking layer.

By means of the material removal of the first semiconductor layer can, for example, at least in sections an absorbing contact layer, which is part of the first semiconductor layer, be removed and/or an outcoupling structuring be formed. The contact layer is in particular provided for the improved contactability of the first semiconductor layer by means of the conducting layer. The contact layer is preferably twice as highly doped as the material of the first semiconductor layer adjacent to the contact layer.

However, such an outcoupling structuring can already be formed at an earlier stage, in particular even before the conducting layer is applied. For example, the outcoupling structuring can be formed immediately after removing the growth substrate.

According to at least one embodiment, the method comprises a step in which the semiconductor layer sequence is secured on a carrier, in particular between the formation of the first connection layer and the formation of the cut-outs. The carrier serves in particular for mechanical stabilization of the semiconductor layer sequence. The fixing can be effected, for example, by means of a connection layer, for instance a soldering layer or an adhesive layer.

According to at least one embodiment, a semiconductor component comprises a semiconductor body with a first semiconductor layer, a second semiconductor layer and an active region arranged between the first semiconductor layer and the second semiconductor layer for generating and/or receiving radiation. A first connection layer is arranged on the side of the second connection layer facing away from the first semiconductor layer. The semiconductor body has at least one cut-out, which extends through the semiconductor body and is completely surrounded by the semiconductor body in a top view of the semiconductor body. A conducting layer is arranged in the at least one cut-out, which establishes an electrically conductive connection between the first semiconductor layer and the first connection layer.

According to at least one embodiment of the semiconductor component, the conducting layer in the at least one cut-out is immediately adjacent to the first semiconductor layer. For example, a lateral surface of the at least one cut-out has a partial area in which the conducting layer is adjacent to the first semiconductor layer. An electrically conductive contact between the first semiconductor layer and the conducting layer can thus ensue via the lateral surface of the cut-out. In other words, no electrically insulating material, in particular no separating layer, is provided at least in sections between the conducting layer and the first semiconductor layer in the cut-out.

According to at least one embodiment of the semiconductor component, the conducting layer is partially arranged on a radiation passage surface of the first semiconductor layer facing away from the active region. The electrical contact of the first semiconductor layer ensues in such case alternatively or additionally to the contact via the lateral surface of the cut-out from the radiation passage surface.

According to at least one embodiment of the semiconductor component, the first semiconductor layer has a contact layer. Said contact layer has in particular a higher doping than a material of the first semiconductor layer adjacent to the contact layer. In particular, the contact layer limits the first semiconductor layer on the side facing away from the active region.

According to at least one embodiment of the semiconductor component, the contact layer is only formed below the conducting layer in a top view of the semiconductor component. The contact layer is thus removed laterally relative to the conducting layer. The risk of a radiation absorption by the contact layer can thus be largely avoided.

According to at least one embodiment of the semiconductor component, a second connection layer for electrically contacting the second semiconductor layer is arranged between the first connection layer and the second semiconductor layer. The second connection layer or a partial layer thereof can be configured as a mirror layer for the radiation to be generated or received in the active area. For example the mirror layer has a reflectivity of at least 60%, preferably at least 80% for a peak wavelength of the radiation to be generated or to be received.

The second connection layer is expediently electrically insulated from the first connection layer, for example by means of an insulation layer arranged between the first and second connection layers.

In a top view of the semiconductor body, the semiconductor component is free of a contact for external electrical contacting, for example a bond pad for a wire bond connection. The arrangement of the contacts is selectable within broad limits. For example, the semiconductor component can have a front-side contact and a rear-side contact, two front-side contacts or two rear-side contacts. The front side in this context is understood to be the side on which the radiation passage surface of the semiconductor body is formed.

The above described method of production is particularly suitable for producing the semiconductor component. Thus, features stated in conjunction with the method can also be used for the semiconductor component and vice versa.

Further features, embodiments and expediencies result from the following description of the exemplary embodiments in conjunction with the figures.

Figure 4:
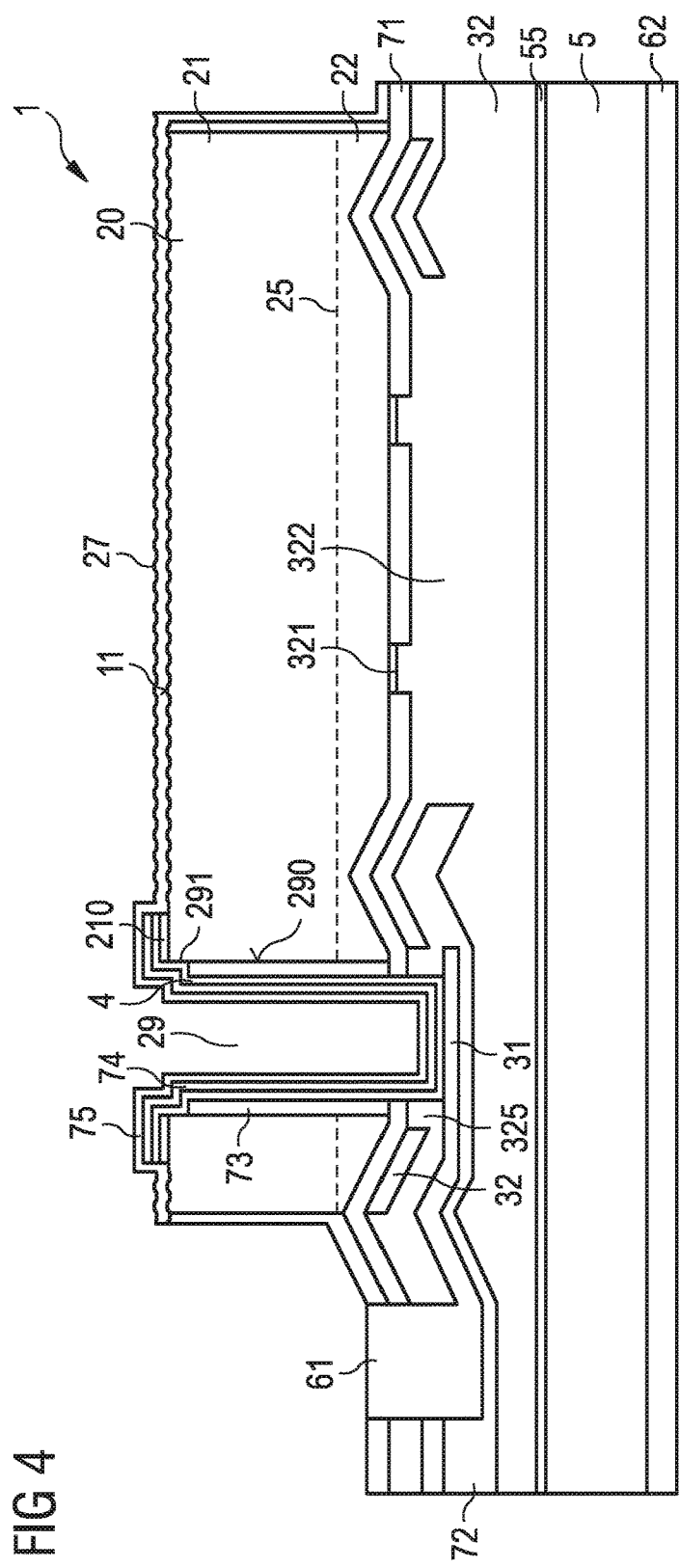
Figure 5:
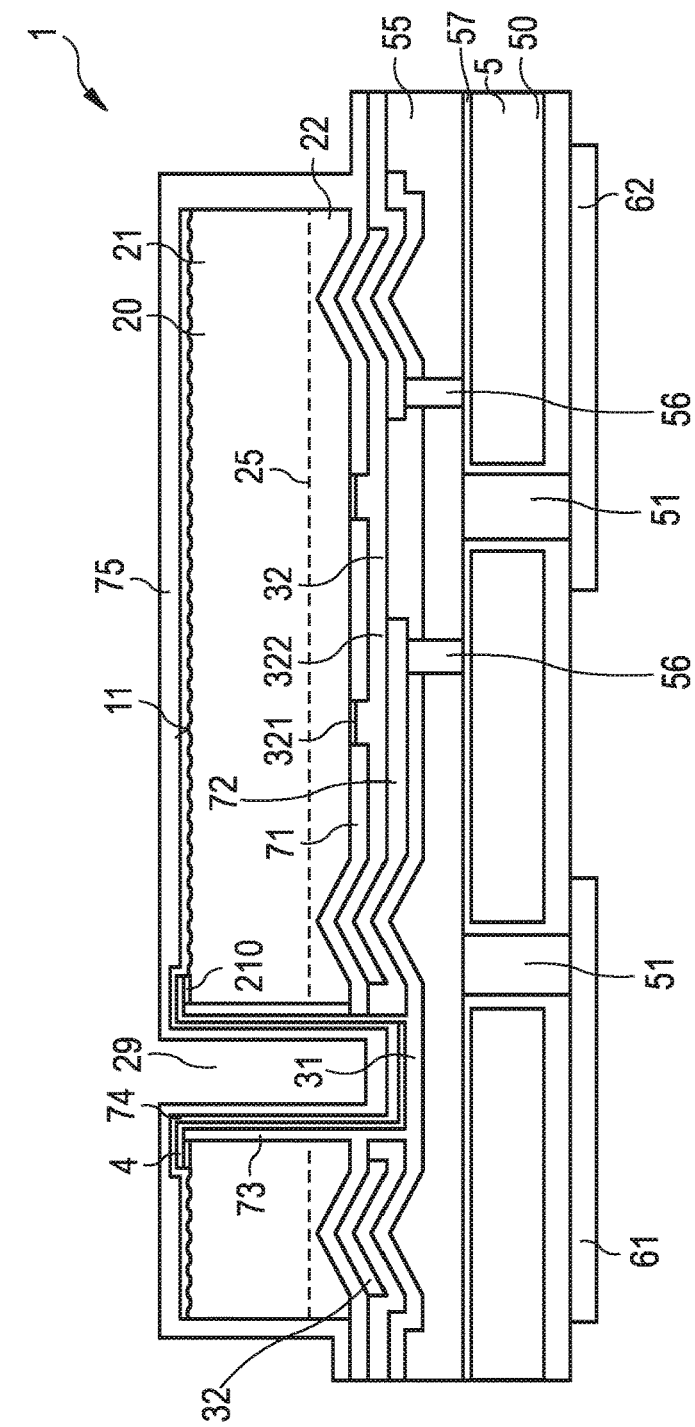

The figures show in:

FIGS. 1A to 1N an exemplary embodiment of a method for producing a semiconductor component on the basis of interim steps schematically shown in sectional view;

FIGS. 2A and 2B each a further exemplary embodiment of a method for producing a semiconductor component on the basis of interim steps schematically shown in sectional view; and FIGS. 3 to 5 each show an exemplary embodiment of a semiconductor component.

Identical, similar and similarly acting elements are indicated with the same reference numerals in the figures.

The figures and size ratios of the elements shown in the figures amongst each other should not be considered as true-to-scale. Instead, individual elements and in particular layer thicknesses can be shown exaggeratedly large for the sake of better representation or the sake of better comprehension.

An exemplary embodiment for a method for producing in particular optoelectronic semiconductor components is provided on the basis of FIGS. 1A to 1N. To simplify the representation, only an excerpt is shown from which precisely one semiconductor component arises in a singulation step. The produced semiconductor components can, for example, be radiation emitters, such as luminescent diodes, or radiation receivers, such as photodiodes or solar cells.

A semiconductor layer sequence 2 comprising an active region 25 for generating and/or receiving electromagnetic radiation is provided. In the exemplary embodiment shown, the active region 25 is configured for generating radiation and has a quantum structure. Said quantum structure comprises a plurality of quantum layers 251, wherein a barrier layer 252 is arranged between adjacent quantum layers. Only two quantum layers are shown in FIG. 1A for the sake of simplified representation, although the active region can have more than two quantum layers. For the sake of simplified representation, the structure of the active region 25 is not explicitly illustrated in the subsequent illustrations. The active region 25 is arranged between a first semiconductor layer 21 and a second semiconductor layer 22. In the exemplary embodiment shown, the first semiconductor layer 21 has a contact layer 210 on the side of the contact layer 210 facing away from the active region 25. The contact layer 210 serves for simplified electrical contact of the first semiconductor layer in a subsequent method step. The contact layer 201 expediently has a higher doping than the material of the first semiconductor layer adjacent to the contact layer, for example a doping of at least $1\times10^{18}$ cm$^{-3}$. However, such a contact layer is not essential.

The first semiconductor layer 21 and the second semiconductor layer 22 are different from each other with regard to the type of conductivity. For example, the first semiconductor layer 21 is n-type and the second semiconductor layer is p-type or vice versa. The deposition of the semiconductor layer sequence 2 ensues on a growth substrate 200, for example by means of epitaxial deposition, such as MOVPE.

The semiconductor layer sequence, in particular the active region 25, preferably contains a III-V compound semiconductor material.

III-V compound semiconductor materials are particularly suitable for radiation generation in the ultraviolet ($Al_x In_y Ga_{1-x-y}N$) via the visible ($Al_x In_y Ga_{1-x-y}N$, in particular for blue to green radiation, or $Al_x In_y Ga_{1-x-y}P$, in particular for yellow to red radiation) up to the infrared ($Al_x In_y Ga_{1-x-y}As$) spectral range. In this context, $0 \leq x \leq 1$, $0 \leq y \leq 1$ and $y \leq 1$, in particular with $x \neq 1$, $y \neq 1$, $x \neq 0$ and/or $y \neq 0$ apply. Further, high internal quantum efficiencies are achievable with III-V compound semiconductor materials, in particular from the stated material systems.

A structuring 26 with a plurality of depressions 260 is formed on the side facing away from the growth substrate 200 (FIG. 1B). The structuring is in particular provided for reducing wave guiding effects and for improving the outcoupling efficiency in the case of a radiation-emitting component. For example, the structuring 26 can be configured in the form of microprisms. However, other configurations are also conceivable, for example an irregular structuring, such as a roughening.

A first insulation layer 71 is formed on the semiconductor layer sequence 2. Said first insulation layer 71 comprises cut-outs 711. The electrical contacting of the second semiconductor layer now ensues via the cut-outs of the first insulation layer. A second connection layer 32 is formed on the insulation layer. Said second connection layer 32 exemplarily comprises a first partial layer 321 and mirror layer 322. The first partial layer is formed in the cut-outs 711 and servers for the electrical contacting of the second semiconductor layer 22. However, the first insulation layer is not essential. It is also conceivable that the second connection layer is adjacent to of the second semiconductor layer in a large area. For the sake of simplified representation, the first partial layer 321 is not explicitly shown in the further interim steps.

The designation of individual layers in the type of a numeration such as "first insulation layer" and "second insulation layer" in the present application serves only the simplified reference to individual layers and does not implicit an order in the production of layers. In addition, the term "second insulation layer" does not necessarily require the presence of a first insulation layer.

The second connection layer 32 further comprises cut-outs 325. The second semiconductor layer 22 is free from metallic material in such cut-outs.

As shown in FIG. 1C, a first connection layer 31 is subsequently applied to the second connection 32. Said second connection layer 32 partially runs between the first connection layer 31 and the second semiconductor layer 22. For electrical insulation between the first connection layer and the second connection layer a second insulation layer is formed between the two connection layers. The second insulation layer covers the entire semiconductor layer sequence. Furthermore, the second insulation layer in the cut-outs 325 of the second connection layer is adjacent to the first insulation layer 71.

No metallic material is located in the area of the cut-outs 325 of the second connection layer 32 between the first connection layer 31 and the second semiconductor layer 22.

The first connection layer 31 covers the entire semiconductor layer sequence 2. No lithographic structuring method is thus required for the formation of the first connection layer 31.

Subsequently, the semiconductor layer sequence is secured to a carrier 5 by means of a connection layer 55, for instance a soldering layer or an electrically conductive adhesive layer. The second semiconductor layer 22 is arranged on the side of the semiconductor layer sequence facing the carrier 5 (FIG. 1D).

The carrier serves the mechanical stabilization of the semiconductor layer sequence 2, and therefore the growth substrate 200 is no longer required to this end and can be removed (FIG. 1E). The removal of the growth substrate can, for example, ensue mechanically, for instance by means of grinding, lapping or polishing and/or chemically, for example by means of wet-chemical or dry-chemical etching.

In particular, the growth substrate can be mechanically thinned in a first partial step. In a second partial step, the remaining residue can be removed by means of a chemical removal method. In deviation thereto, it is also conceivable that the growth substrate 200 is already removed during the securing process on the carrier. In such case, the semiconductor layer sequence can for example be stabilized by a temporary auxiliary carrier during the securing process on the carrier.

As shown in FIG. 1F, cut-outs 29 are formed from the side facing away from the carrier 5, which extend completely through the semiconductor layer sequence 2. At the same time, isolation trenches 28 are formed for subdividing the semiconductor layer sequence 2 into semiconductor bodies 20 laterally spaced from each other. The formation of the cut-outs 29 and of the isolation trenches 28 in one production step reduces the production outlay. However, the cut-outs and the isolation trenches can also be formed successively in completely separate steps. The cut-outs and the isolation trenches are spaced apart from each other in lateral direction, and therefore the cut-outs of the individual semiconductor bodies are each surrounded by material of the semiconductor body along the entire circumference. The cut-outs 29 and/or isolation trenches 28 can have perpendicular flanks, i.e. flanks running parallel to the vertical direction. Alternatively, the flanks can be formed obliquely to the vertical direction, wherein the cross-section of the cut-outs 29 and/or isolation trenches 28 tapers in the direction of the carrier 5.

In a top view, the cut-outs 29 in the semiconductor layer sequence overlap with the cut-outs 325 of the second connection layer 325. In particular, the cut-outs 29 run completely within the cut-outs 325 of the second connection layer 325.

Subsequently, material for a separating layer 73 is deposited by means of a conformally acting method, for example by means of a CVD (chemical vapour deposition) method or ALD (atomic layer deposition) method. A conformally deposited layer follows to the form of the material located below. The material of the separating layer covers the entire semiconductor layer sequence, in particular including the lateral surfaces of the cut-outs 29 and the isolation trenches 28.

As shown in FIG. 1G, the separating layer 73 is completely subjected to a directionally selective etching method, such that surfaces running parallel to the main extension plane of the semiconductor layers of the semiconductor layer sequence 2 are freed from the material of the separating layer. The separating layer 73 is thus located only on the lateral surfaces running obliquely or perpendicularly to the main extension plane, in particular on the lateral surfaces 290 of the cut-outs 29 and on the lateral surfaces of the isolating trenches 28.

Thus, the directionally selective etching method allows a separating layer to be realized that effects an electrical insulation of the lateral surfaces of the cut-outs 29 in the area of the cut-outs, without a lithography method being required to this end. Instead, the formation of the separating layer 73 is self-aligned. The waive of two lithographic steps aligned with each other for the formation of the coated cut-outs allows the lateral extension of the cut-outs 29 to be reduced, thus decreasing the proportion of the active region 25, which is lost by the formation of the cut-outs 29. For example, a dry-chemical etching method is suitable as a directionally selective etching method, such as reactive ion etching.

As shown in FIG. 1H, a masking layer 8, for example a photo resist layer is subsequently applied to the semiconductor layer sequence 2. The masking layer is designed in such a way that openings 81 are formed in the masking layer, wherein the cut-outs 29 are completely arranged within the openings 81 in a top view of the semiconductor layer sequence 2. With increasing distance from the semiconductor layer sequence 2, the cross-section of the openings 81 decreases, such that an undercut area is created.

Subsequently, as illustrated in FIG. 1I, material of the separating layer 73 is removed by means of another directionally selective method. The further directionally-selective method as well has a higher etching rate in the vertical direction than in the lateral direction. The material covering the lateral surfaces 29 is thus removed in the vertical direction. Therefore, the lateral surfaces 290 of cut-outs 29 in each case comprise a partial area 291, in which the first semiconductor layer 21 is exposed. In particular, the partial area is adjacent to the contact layer 210.

Further, the material located between the first connection layer 31 and the cut-outs 29 is removed on the bottom of the cut-outs 29 such that the first connection layer 31 is exposed by means of the further directionally selective etching method. In particular, material of the second insulation layer 72 is removed in the area of cut-outs 29. Exposure of the first connection layer 31 ensues in the cut-outs 325 of the second connection layer. Thus, no metallic material has to be removed when exposing said layer.

Subsequently, as illustrated in FIG. 1J, a conducting layer 4 is applied to the semiconductor layer sequence 2 covering its entire surface. Material of the conducting layer 4 covers the lateral surfaces 290 of cut-outs 290 and the mask layer 8. Preferably, deposition of the conductive layer ensues in a main deposition direction (indicated by an arrow 95), which runs obliquely to the vertical direction such that partial areas of the first semiconductor layer are covered by the conductive layer, which areas are covered by the mask layer 8 in a top view. Thus, the material deposited on the first semiconductor layer 4 and the material deposited on the mask layer overlap in areas in a top view. Preferably, the semiconductor layer sequence is rotated during deposition of the conducting layer such that the conducting layer 4 completely circumvents the cut-outs 29 on the first semiconductor layer.

Subsequently, a covering layer 74 is deposited over its entire surface (FIG. 1K), preferably as well with a main deposition direction running obliquely to the vertical direction.

After removal of the mask layer 8 (FIG. 1L), the areas of the semiconductor layer previously covered by the masking layer are free from the covering layer 74. In particular, the covering layer 74 completely covers the conducting layer 4.

The masking layer 74 can now serve as a mask for a material removal of the semiconductor layer sequence 2 (FIG. 1M). During material removal, the contact layer 210 can be removed in sections such that the latter is only present below the covering layer 74 and the conducting layer 4. A good ohmic contact to the conducting layer 4 can be achieved by means of the contact layer 210. Lateral from the conducting layer 4, the material of the contact layer 210 is removed such that the risk of a radiation absorption by the contact layer 210 is reduced. This achieves a good electrical conductivity and at the same time reduced absorption losses in a simple and reliable manner. In particular, no additional photolithographic step is required to that end.

In the material removal of material of the semiconductor layer sequence, furthermore an outcoupling structuring 27 can be formed, e.g. in the form of a roughening.

Subsequently, as illustrated in FIG. 1N, optionally a passivation layer 75 is applied to the semiconductor layer sequence. It is as well conceivable to additionally form a radiation conversion layer (not explicitly shown) on the passivation layer or to provide a radiation conversion material in the passivation layer.

The carrier 5 is thinned from the side facing away from the semiconductor layer sequence 2. Thereby the height of the component can be reduced. Prior to the thinning, the carrier may comprise a higher mechanical robustness due to the higher thickness. As an alternative, the semiconductor layer sequence 2 can be applied onto a carrier, which carrier already has the final thickness desired in the completed semiconductor component.

A first contact 61 is formed on the side of the carrier 5 facing away from the semiconductor layer sequence 5. In this present exemplary embodiment, the first contact 5 is connected to the first semiconductor layer 21 via the carrier 5, the first connection layer 31 and the conducting layer 4. A second contact 62 for electrically contacting the second semiconductor layer 22 via the second connection layer 32 is formed laterally from the semiconductor body 20 on the side of the carrier 5 facing the semiconductor layer sequence 2.

By application of an external electric voltage between the first contact 61 and the second contact 62, charge carriers can be injected into the active region 25 from opposing sides and will recombine there while emitting radiation.

For the formation of the individual semiconductor components, the compound thus produced will be singulated along the singulation lines so that the produced semiconductor components in each case comprise a part of the carrier 5 and a semiconductor body 20 with at least one cut-out 29.

The method described allows producing semiconductor components in a simple and reliable manner, wherein the semiconductor body 2, particularly the radiation passage surface 11, is free of structures for current distribution and an external contact, for example for a wire bond connection. The electric contacting of the first semiconductor layer 21 arranged on the side of the active region 25 facing away from the carrier 5 may be effected by the cut-outs 29, wherein the cut-outs 29 can be produced in a self-adjusting process in a reliable and simple manner such that the conducting layer 4 is electrically insulated in the cut-outs from the second semiconductor layer 22 and the active region 25.

FIG. 1N shows an exemplary embodiment of a semiconductor component 1 produced this way. The semiconductor component 1, merely by way of example, comprises a rear-sided first contact 61 and a front-sided contact 62, arranged particularly laterally from the semiconductor body 2.

The first insulation layer 71, the second insulation layer 72, the separation layer 73, the cover layer 74 and the passivation layer 75 preferably each contain an electrically insulting material, for example an oxide such as silicon oxide, or a nitride such as silicon nitride.

The first connection layer 31, the second connection layer 32, the first contact 61 and the second contact 62 preferably each comprise a metal or consist of a metal or a metal alloy. The layers may in each case have a single-layered or multi-layered design.

A further exemplary embodiment for a method is shown with reference to the intermediate steps illustrated in FIG. 2A. This exemplary embodiment essentially corresponds to the exemplary embodiment described in conjunction with FIGS. 1A to 1N.

Here, FIG. 2A essentially corresponds to FIG. 1B. In contrast, the cut-out 325 of the second connection layer 32 is located in one of the depressions 260a of the structure 26. Preferably, the lateral extent of the depressions 260a has a size that the cut-out 325 of the second connection layer 32 is completely located within the depression. The remaining depressions 260 may have a smaller lateral extent. Thus, removing the entire thickness of the semiconductor layer sequence is no longer required when subsequently forming the cut-outs through the semiconductor layer sequence (see FIG. 1F).

The further production steps can be performed as described in connection with the first exemplary embodiment.

A further exemplary embodiment for a method is shown with reference to the intermediate step illustrated in FIG. 2B. This exemplary embodiment essentially corresponds to the exemplary embodiment illustrated in FIG. 2A. In contrast, in the step shown in FIG. 2B, the first insulation layer 71 is formed such that the first insulation layer has openings 712 in the region of the cut-outs 29 to be produced through the semiconductor layer sequence. The electric contacting of the first connection layer 31 via the conductor layer 4 can be effected by these openings (see FIG. 1J). In contrast to the intermediate step illustrated in FIG. 1I, partial removal of the first insulation layer in the cut-outs 29 after removal of the semiconductor layer sequence is not required. This way, exposure of the first connection layer 31 is facilitated.

The first partial layer 321 of the second connection layer provided for the electrical contacting of the second semiconductor layer 22 can be applied in the openings 712 just like in the cut-outs 711. Subsequently, said layer can be removed in the openings, particularly in the step in which the second connection layer 32 is being structured.

This allows for the forming of the openings 712 to be effected without additional lithography mask in a simple manner. The openings 712 for electrical contacting of the first semiconductor layer 21 and the cut-outs 711 for electrical contacting of the second semiconductor layer 22 can thus be formed in a joint method.

The further production steps can be performed as described in conjunction with the first exemplary embodiment. The exemplary embodiment illustrated in FIG. 2B is also suitable for the first exemplary embodiment.

In contrast to the exemplary embodiment illustrated in FIG. 1N, the exemplary embodiment of a semiconductor component 1 illustrated in FIG. 3 comprises two front-sided contacts. The first contact 61 is thus not arranged on the rear side of the carrier 5 but also laterally from the semiconductor body 20. In this case, the carrier 5 may just as well be configured to be electrically insulating.

The exemplary embodiment illustrated in FIG. 4 comprises, just like the exemplary embodiment shown in FIG. 1N, a front-sided contact and a rear-sided contact. In contrast, the first contact 61 which is connected to the first semiconductor layer 21 in an electrically conducting manner is the front-sided contact. The second contact 62 connected to the second semiconductor layer 22 forms a rear-sided contact. Thus, in this case, the semiconductor layer arranged on the side of the active region 25 facing the carrier, namely the second semiconductor layer 22, can be contacted to a rear-sided contact externally through the carrier.

In the exemplary embodiment illustrated in FIG. 4, in contrast to the exemplary embodiment described in conjunction with FIG. 1N, a semiconductor component 1 is shown, in which the first contact 61 and the second contact 62 are formed on the rear side of the carrier 5. In this case, the carrier 5 has through-connections 51. Both contacts of the semiconductor component 1 are accessible from the rear side. The carrier 5 includes a carrier body 50 with cut-outs, the through-connections extending through said cut-outs in the vertical direction. The carrier body is sectionally covered by a carrier insulation layer 57, in particular in the region of the through-connections 51, on a main face facing the semiconductor body 20 and a main face facing away from the semiconductor body. The first connection layer 31 and the second connection layer 32 are insulated from one another electrically via an intermediate space 56. For example, the intermediate space can be filled with a gas such as air or an inert gas or be evacuated. As an alternative, the intermediate space may be filled with an electrically insulating solid material.

This patent application claims the priority of the German patent application 10 2014 102 029.4, the disclosure of which is incorporated herein by reference.

The invention is not limited by the description in conjunction with the exemplary embodiments. The invention rather comprises all new features as well as any combination of features, which particularly includes any combination of features in the patent claims, even if said feature or said combination is not explicitly indicated in the patent claims or exemplary embodiments.

The invention claimed is:

1. A method for producing a plurality of semiconductor components, comprising the steps of:
   a) providing a semiconductor layer sequence having a first semiconductor layer, a second semiconductor layer and an active region, arranged between the first semiconductor layer and the second semiconductor layer provided for generating and/or receiving radiation;
   b) forming at least one depression on a side of the second semiconductor layer facing away from the first semiconductor layer;
   c) forming a first connection layer on the side of the second semiconductor layer facing away from the first semiconductor layer;
   d) forming a plurality of cut-outs through the semiconductor layer sequence;
   e) forming a conducting layer in the cut-outs for establishing an electrically conductive connection between the first semiconductor layer and the first connection layer; and
   f) singulating into the plurality of semiconductor components,
   wherein a semiconductor body having at least one of the plurality of cut-outs arises from the semiconductor layer sequence for each semiconductor component and the at least one cut-out is completely surrounded by the semiconductor body in a top view of the semiconductor body, and
   wherein the first semiconductor layer has a contact layer which is formed solely below the conducting layer in a top view of the semiconductor component.

2. The method according to claim 1, wherein a separating layer is applied between the active region and the conducting layer for electrical insulation, the separating layer covering the lateral surfaces of the cut-outs at least on the level of the second semiconductor layer and of the active region.

3. The method according to claim 2, wherein material for the separating layer is applied over the entire semiconductor layer sequence with the cut-outs for forming the separating layer, and the material is removed in such a way, by means of a directionally selective etching method, that only surfaces running obliquely or perpendicularly to a main extension plane of the semiconductor layers of the semiconductor layer sequence remain covered by the separating layer.

4. The method according to claim 3, wherein further material of the separating layer is removed in a subsequent further directionally selective etching method and the first semiconductor layer in the cut-outs is sectionally exposed.

5. The method according to claim 4, wherein the first connection layer is exposed by the further directionally selective etching method.

6. The method according to claim 1, wherein a first insulation layer with openings is formed before forming the cut-outs between the semiconductor layer sequence and the first connection layer, wherein the cut-outs are formed in such a way that they overlap with the openings in a top view of the semiconductor layer sequence.

7. The method according to claim 1, wherein a growth substrate for the semiconductor layer sequence is removed before step c).

8. The method according to claim 1, wherein a masking layer with a plurality of openings is applied to the semiconductor layer sequence before applying the conducting layer and each cut-out is completely arranged within one of the plurality of openings in a top view and the first semiconductor layer laterally to the cut-outs is partially free from the masking layer.

9. The method according to claim 8, wherein the openings taper with increasing distance from the semiconductor layer sequence and material for the conducting layer, with a main deposition direction running obliquely to a vertical direction running perpendicular to a main extension plane of the semiconductor layer sequence, is deposited such that the material of the conducting layer deposited in the openings overlaps with material of the conducting layer deposited on the masking layer in a top view.

10. The method according to claim 1, wherein a covering layer is applied to the conducting layer and the covering layer serves as mask for removing material from the first semiconductor layer.

11. The method according to claim 1, wherein the semiconductor layer sequence is secured to a carrier between step b) and step c).

12. The method according to claim 1, wherein the contact layer is a semiconductor layer.

13. The method according to claim 1, wherein the contact layer has a higher doping than a material of the first semiconductor layer adjacent to the contact layer.

14. The method according to claim 1, wherein a second connection layer is applied to the second semiconductor layer, wherein the second connection layer is arranged in vertical direction between the first connection layer and the second semiconductor layer, and wherein the second connection layer and the first connection layer overlap in a top view of the semiconductor body.

15. The method according to claim 1, wherein the cut-outs are each surrounded by material of the contact layer along the entire circumference of the cut-outs.

16. A semiconductor component comprising:
   a semiconductor body comprising a first semiconductor layer, a second semiconductor layer and an active region arranged between the first semiconductor layer and the second semiconductor layer for generating and/or receiving radiation;
   a first connection layer arranged on a side of the second semiconductor layer facing away from the first semiconductor layer,
   wherein the semiconductor body has at least one cut-out extending through the semiconductor body and the cut-out is completely surrounded by the semiconductor body in a top view of the semiconductor body; and
   a conducting layer arranged in the at least one cut-out and forming an electrically conductive connection between the first semiconductor layer and the first connection layer,
   wherein the first semiconductor layer has a contact layer which is formed solely below the conducting layer in a top view of the semiconductor component, and
   wherein the side of the second semiconductor layer facing away from the first semiconductor layer comprises at least one depression.

17. The semiconductor component according to claim 16, wherein the conducting layer is immediately adjacent to the first semiconductor layer in the at least one cut-out.

18. The semiconductor component according to claim 16, wherein the conducting layer is partially arranged on a radiation passage surface which is arranged on a side of the first semiconductor layer facing away from the active region.

19. The semiconductor component according to claim 16, wherein a second connection layer is arranged between the first connection layer and the second semiconductor layer for electrically contacting the second semiconductor layer.

20. The semiconductor component according to claim 16, wherein the semiconductor component further comprises a separating layer, the separating layer covers a lateral surface of the cut-out at least on the level of the second semiconductor layer and of the active region, and wherein the lateral surface comprises a partial area in which the first semiconductor layer is free from the separating layer.

21. A method for producing a plurality of semiconductor components, comprising the steps of:
   a) providing a semiconductor layer sequence having a first semiconductor layer, a second semiconductor layer and an active region, arranged between the first semiconductor layer and the second semiconductor layer provided for generating and/or receiving radiation;
   b) forming at least one depression on a side of the second semiconductor layer facing away from the first semiconductor layer;
   c) forming a first connection layer on the side of the second semiconductor layer facing away from the first semiconductor layer;
   d) forming a plurality of cut-outs through the semiconductor layer sequence;
   e) forming a conducting layer in the cut-outs for establishing an electrically conductive connection between the first semiconductor layer and the first connection layer; and
   f) singulating into the plurality of semiconductor components,
   wherein a semiconductor body having at least one of the plurality of cut-outs arises from the semiconductor layer sequence for each semiconductor component and the at least one cut-out is completely surrounded by the semiconductor body in a top view of the semiconductor body;
   wherein a separating layer is applied between the active region and the conducting layer for electrical insulation, the separating layer covering the lateral surfaces of the cut-outs at least on the level of the second semiconductor layer and of the active region,
   wherein a material of the separating layer covering the lateral surfaces is removed such that the lateral surfaces comprise a partial area in which the first semiconductor layer is free from the separating layer, and wherein the first semiconductor layer has a contact layer which is formed solely below the conducting layer in a top view of the semiconductor component.

* * * * *